United States Patent
Laurent et al.

(10) Patent No.: US 11,811,424 B2
(45) Date of Patent: Nov. 7, 2023

(54) FIXED WEIGHT CODEWORDS FOR TERNARY MEMORY CELLS

(71) Applicant: Micron Technology, Inc., Boise, ID (US)

(72) Inventors: Christophe Vincent Antoine Laurent, Agrate Brianza (IT); Riccardo Muzzetto, Arcore (IT)

(73) Assignee: Micron Technology, Inc., Boise, ID (US)

( * ) Notice: Subject to any disclaimer, the term of this patent is extended or adjusted under 35 U.S.C. 154(b) by 241 days.

(21) Appl. No.: 17/222,660

(22) Filed: Apr. 5, 2021

(65) Prior Publication Data
US 2022/0321147 A1  Oct. 6, 2022

(51) Int. Cl.
*G11C 29/52* (2006.01)
*H03M 13/29* (2006.01)
*G11C 15/04* (2006.01)
*G06F 11/10* (2006.01)

(52) U.S. Cl.
CPC ..... *H03M 13/2906* (2013.01); *G06F 11/1076* (2013.01); *G11C 15/04* (2013.01)

(58) Field of Classification Search
CPC .............. H03M 13/2906; H03M 13/51; G06F 11/1076; G06F 11/1048; G11C 15/04; G11C 7/1006; G11C 11/5628; G11C 16/08; G11C 29/42; G11C 29/52
USPC ........................................................ 714/755
See application file for complete search history.

(56) References Cited

U.S. PATENT DOCUMENTS

| | | | | |
|---|---|---|---|---|
| 6,114,979 A | * | 9/2000 | Kim | H03M 7/04 341/57 |
| 6,839,256 B1 | * | 1/2005 | Proebsting | G11C 15/00 365/49.16 |
| 7,050,317 B1 | * | 5/2006 | Lien | G11C 15/00 365/49.1 |
| 7,979,775 B2 | * | 7/2011 | Yu | H03M 13/258 714/760 |

(Continued)

FOREIGN PATENT DOCUMENTS

| | | | |
|---|---|---|---|
| DE | 102013007692 A1 * | 11/2013 | ..... G06F 11/1012 |
| EP | 0920029 A2 | 6/1999 | |
| TW | I714058 B | 12/2020 | |

OTHER PUBLICATIONS

"International Search Report and Written Opinion of the International Searching Authority," issued in connection with Int'l Appl. No. PCT/US2022/071264, dated Jun. 30, 2022, 9 pages.

(Continued)

*Primary Examiner* — Albert Decady
*Assistant Examiner* — Enam Ahmed
(74) *Attorney, Agent, or Firm* — Holland & Hart LLP

(57) ABSTRACT

Methods, systems, and devices for fixed weight codewords for ternary memory cells are described. A memory device may generate a codeword from a set of data bits and invert a portion of the codeword so that the codeword is associated with a target distribution of programmable states. After inverting the portion of the codeword, the memory device store the codeword in a set of ternary cells according to a coding scheme. The memory device may read the codeword from the set of ternary cells and select one or more reference voltages for the set of ternary cells based on the target distribution for the codeword and the states of the ternary cells.

30 Claims, 12 Drawing Sheets

(56) References Cited

U.S. PATENT DOCUMENTS

| | | | |
|---|---|---|---|
| 8,169,808 B2 | 5/2012 | Roohparvar | |
| 8,667,361 B1* | 3/2014 | Varnica | H03M 13/1108 |
| | | | 714/755 |
| 10,714,169 B1* | 7/2020 | Reusswig | G11C 11/5671 |
| 2010/0332729 A1 | 12/2010 | Alrod et al. | |
| 2014/0006896 A1* | 1/2014 | Wu | H03M 13/453 |
| | | | 714/755 |
| 2014/0164881 A1 | 6/2014 | Chen et al. | |
| 2014/0289584 A1* | 9/2014 | Chilappagari | G06F 11/1068 |
| | | | 714/755 |
| 2015/0317203 A1 | 11/2015 | Zhou | |
| 2017/0162258 A1* | 6/2017 | Anholt | G11C 11/56 |
| 2018/0004596 A1 | 1/2018 | Zhang et al. | |
| 2019/0325963 A1 | 10/2019 | Noack | |
| 2020/0241959 A1 | 7/2020 | Wang et al. | |

OTHER PUBLICATIONS

Taiwanese Patent Office, "Office Action," issued in connection with Taiwanese Patent Application No. 111110746 dated Jan. 19, 2023 (15 pages) (5 pages of Original Document and 10 pages of English Translation).

* cited by examiner

US 11,811,424 B2

FIXED WEIGHT CODEWORDS FOR TERNARY MEMORY CELLS

FIELD OF TECHNOLOGY

The following relates generally to one or more systems for memory and more specifically to fixed weight codewords for ternary memory cells.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

A memory device may include memory cells with threshold voltages that drift over time, which may negatively impact sensing accuracy. To compensate for threshold voltage drift in binary cells (e.g., which may be programmable to two states), the memory device may implement a reference scheme that relies on fixed weight codewords (e.g., codewords with a fixed ratio of logic ones and logic zeros). But techniques used to generate fixed weight codewords for storage in binary memory cells may not be compatible with ternary memory cells (e.g., which may be programmable to three states). Thus, a memory device may implement the techniques described herein to 1) generate fixed weight codewords for storage in ternary memory cells, and 2) use the fixed weight codewords to set reference voltages as part of a dynamic reference scheme for the ternary memory cells.

In a first technique, a memory device may strategically divide a data set into a first sub-message and a second sub-message (e.g., based on a coding scheme discussed in more detail herein) and generate a codeword for each sub-message (e.g., a first codeword and a second codeword). The memory device may invert a portion of the first codeword, a portion of the second codeword, or both, based on the coding scheme and so that each codeword is associated with a respective target distribution of programmable states. After inverting the portion(s) of the codeword(s), the memory device may store the two codewords (e.g., according to the coding scheme) in a memory array of ternary memory cells. During a retrieval operation, for example, the memory device may use the first codeword to set a first reference voltage for the ternary memory cells and may use the second codeword to set a second reference voltage for the ternary memory cells.

In a second technique, a memory device may generate a codeword for a data set. After inverting a portion of the codeword according to the coding scheme and so that the codeword is associated with a target distribution of programmable states, the memory device may store the codeword (e.g., according to the coding scheme) in a memory array of ternary memory cells. During a retrieval operation, for example, the memory device may use the codeword to set both the first reference voltage and the second reference voltage.

Features of the disclosure are initially described in the context of a system as described with reference to FIG. 1. Features of the disclosure are described in the context of a memory cell distribution graph and a coding scheme, as described with reference to FIG. 2. Features of the disclosure are also described with reference to storage and retrieval processes as described with reference to FIGS. 3-6. These and other features of the disclosure are further illustrated by and described with reference to apparatus diagrams and flowcharts that relate to generating a fixed weight codeword for ternary cells as described with reference to FIGS. 7-12.

Figure 1:
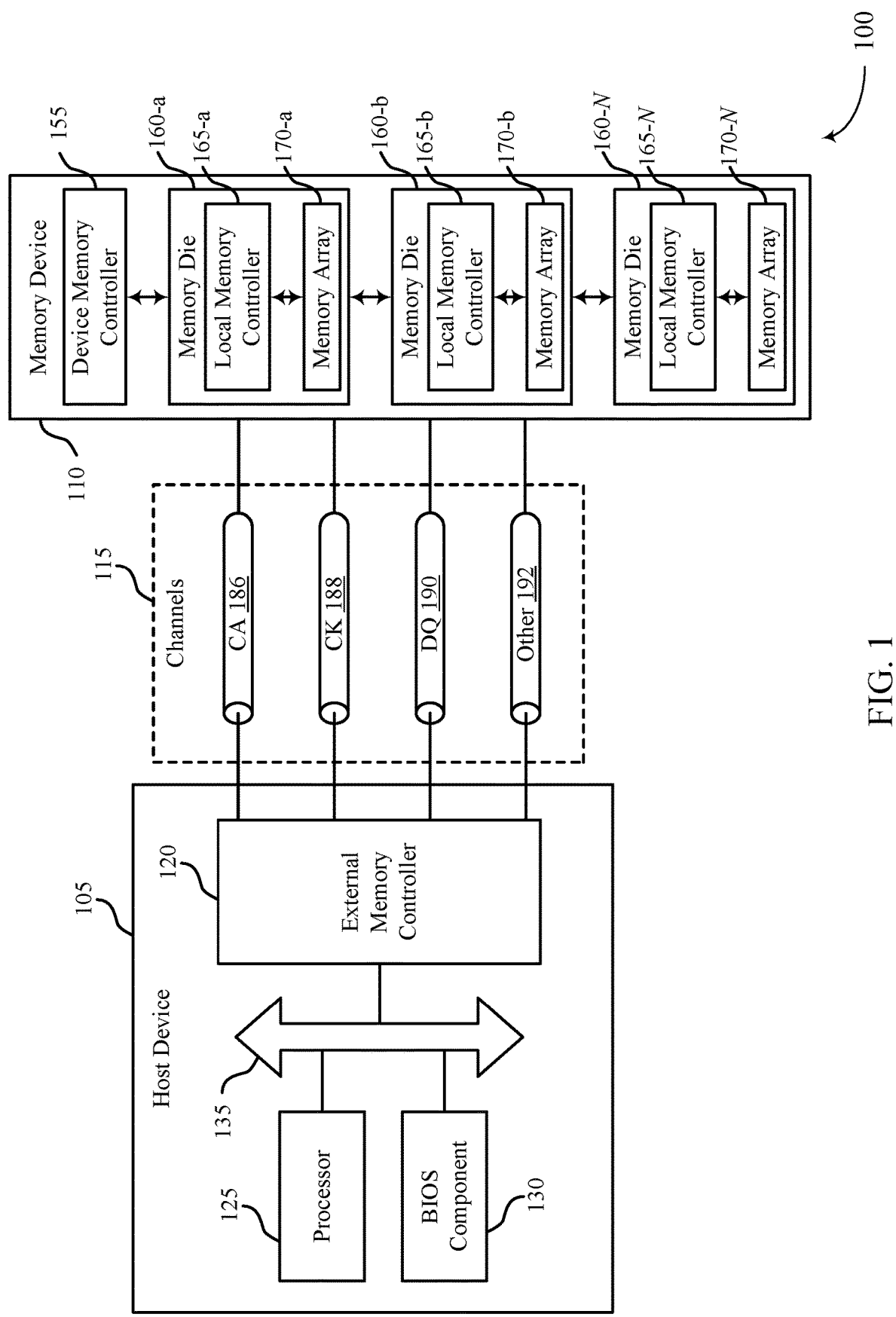
FIG. 1 illustrates an example of a system that supports fixed weight codewords for ternary memory cells in accordance with examples as disclosed herein.

FIG. 1 illustrates an example of a system 100 that supports fixed weight codewords for ternary memory cells in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160 a, memory die 160 b, memory die 160 N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell programmable to at least one state. In some examples, the memory cells may be phase change memory cells. A memory device 110 including two or more memory dies 160 may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share one or more access lines for applying voltages or sensing memory cells.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

Data stored in the memory device 110 may become corrupted over time, resulting in one or more errors in the data. To increase the reliability of the memory device 110, the memory device 110 may implement an error correction scheme to detect, identify, and correct such errors. For example, before storing a set of data bits the memory device 110 may use an error correction code to generate a codeword—made up of the data bits and corresponding parity bits—that can be used by the memory device 110 to detect errors in the codeword. The parity bits may be generated by applying the error correction code to the set of data bits, which may involve inputting the set of data bits into a logic circuit made up of, for example, a series of XOR logic gates. The memory device 110 may store the set of data bits and the parity bits (collectively referred to as a "codeword") in memory so that one or more errors in the codeword can be detected (and possibly corrected) during a read operation. For example, the memory device 110 may detect an error in the codeword based on syndrome bits that are generated (e.g., during a decoding process) from the bits of the codeword stored in memory.

The state of a memory cell (which may be used to represent one or more data bits) may be determined based on the presence or absence (or magnitude) of a signal output by the memory cell (e.g., an output current, an output voltage) in response to an applied reference voltage. For example, a memory cell may output current if the reference voltage applied to the memory cell overcomes (e.g., is greater than) the threshold voltage of the memory cell, and the memory cell may output no current (or a negligible amount of current) if the reference voltage applied to the memory cell is less than the threshold voltage. So, the state of a memory cell may be set by setting the threshold voltage of the memory cell and may be determined by sensing a signal output by the memory cell in response to an applied reference voltage.

But the threshold voltage of a memory cell may vary over time. For example, the threshold voltages of memory cells in the memory device 110 may drift (e.g., increase) over time, eventually reaching a point at which a fixed reference voltage (or other reference signal) results in an inaccurate reading of the memory cells. To compensate for threshold voltage drift and mitigate the reliability issues that arise from such drift, the memory device 110 may implement a dynamic reference sensing scheme that relies on the storage of fixed weight codewords (which may also be referred to as balanced codewords).

In the ternary cell context, a fixed weight codeword may refer to a codeword that is associated with a fixed distribution of programmable states. Put another way, a fixed weight codeword may be a codeword that, when stored in ternary cells, results in a fixed (e.g., set) quantity of ternary cells in each state. The weight of a codeword may refer to the distribution of programmable states associated with the codeword. To appropriately weight a codeword, which may be referred to as balancing the codeword, the memory device 110 may map the bits in the codeword to packets and employ a balancing process in which the packets are inverted (e.g., one at a time) until a determined weight has been achieved (e.g., until the codeword is balanced). To ensure that the original logic values of a balanced codeword can be accurately recovered during a subsequent read operation, the memory device 110 may explicitly or implicitly store balancing information bits that indicate which packets of the data were inverted during the balancing process. During a read operation, the memory device 110 may reference the balancing information bits so that the memory device 110 can un-invert the proper packets of the bits (e.g., those inverted during the balancing process) before data bits from the codeword are returned to a requesting device.

Balancing codewords before storage may allow the memory device 110 to implement various techniques that improve operation of the memory device 110. For example, as noted above, the storage of balanced codewords may facilitate the use of a dynamic reference sensing scheme that mitigates the negative effects of threshold voltage drift. According to the techniques described herein, the memory device 110 may generate balanced codewords for storage in ternary memory cells so that the memory device 110 can use a dynamic reference sensing scheme to set a first reference voltage and a second reference voltage for ternary memory cells.

In accordance with a first technique, the memory device 110 may strategically divide a data set into two sub-messages (e.g., based on a coding scheme discussed in more detail herein) and generate a codeword for each sub-message. After balancing the two codewords, the memory device 110 may store the two codewords (according to the coding scheme) in a memory array of ternary memory cells. During a retrieval operation, the memory device 110 may use a first one of the codewords to set the first reference voltage and may use a second one of the codewords to set the second reference voltage. The first technique is described in more detail herein and with respect to FIGS. 3 and 4. In accordance with a second technique, the memory device 110 may generate a codeword for a data set. After balancing the codeword, the memory device 110 may store the codeword (according to the coding scheme) in a memory array of ternary memory cells. During a retrieval operation, the memory device 110 may use the codeword to set both the first reference voltage and the second reference voltage for the ternary memory cells. The first technique is described in more detail herein and with respect to FIGS. 5 and 6. Although described as separate techniques, it should be understood that aspects of the first technique and the second technique can be combined to realize one or more aspects of the advantages described herein.

Figure 2:
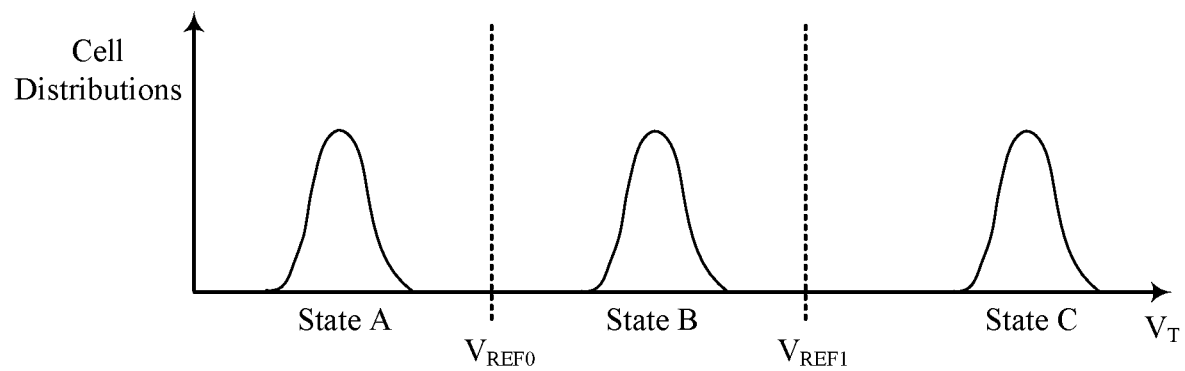
FIG. 2 illustrate examples of a memory cell distribution and a coding scheme that supports fixed weight codewords for ternary memory cells in accordance with examples as disclosed herein.
Figure 2:
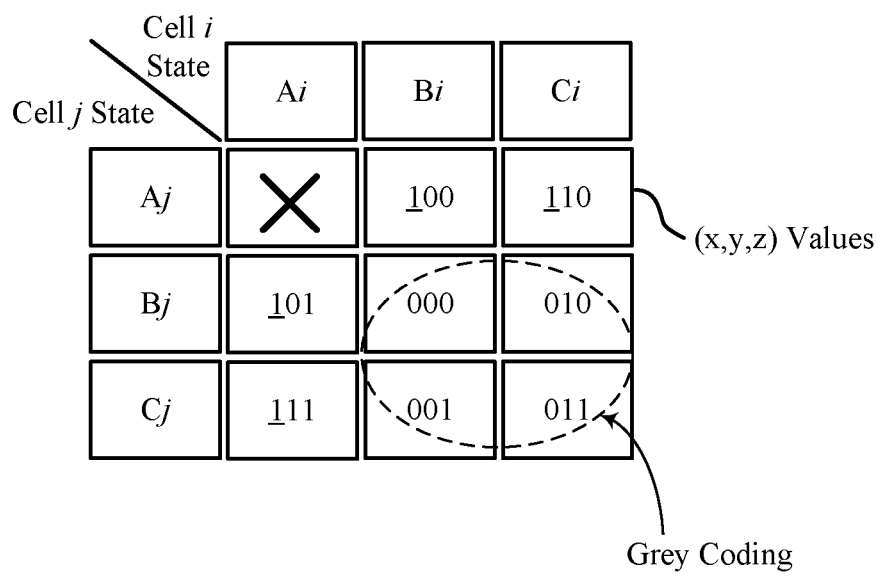

FIG. 2 illustrates an example of a memory cell distribution graph 200 and a coding scheme 205 that support fixed weight codewords for ternary memory cells in accordance with examples as disclosed herein. The memory cell distribution graph 200 shows a possible distribution of threshold voltages for ternary memory cells that are programmable to three different states: State A, State B, and State C. To determine (e.g., sense) the state of a ternary memory cell, a memory device may use two reference voltages: a first reference voltage (denoted $V_{REF0}$) for differentiating between (e.g., distinguishing) State A and states other than State A, and a second reference voltage (denoted $V_{REF1}$) for differentiating between State C and states other than State C. The memory device may apply each reference voltage to the memory cell and determine the state of the memory cell based on the output (or lack thereof) of the memory cell in response to the applied reference voltage.

A memory device may set $V_{REF0}$ and $V_{REF1}$ using a dynamic reference technique that relies on fixed weight codewords. The fixed weight codewords may be generated based on a target distribution of states and the coding scheme 205. A target distribution may define a target quantity for one or more states (e.g., a target quantity for State A, a target quantity for State B, a target quantity for State C).

In a first dynamic reference technique (which may also be referred to as a median-based technique), the memory device may apply (e.g., during a series of read operations) increasingly higher voltage levels to the ternary cells until the quantity of ternary cells in State A is equal to a target quantity (e.g., the median quantity of cells for State A, as defined by the target distribution). Once the target quantity of ternary cells in State A is detected, the memory device may set the level of $V_{REF0}$ to be the last voltage level used to read the ternary cells (e.g., the voltage level that resulted in the target quantity of ternary cells in State A) plus a margin that is based on the width of the State A distribution (e.g., the range of threshold voltages for State A). A similar process may be used to set the level of $V_{REF1}$ based on the quantity of ternary cells in State B. Due to the relatively imprecise nature of the first dynamic reference technique, the first dynamic reference technique may be used with codewords that are relatively imprecisely weighted, which may refer to codewords that are associated with a distribution of states that is different from the target distribution. The generation of codewords compatible with the first dynamic reference technique, among other dynamic reference techniques, is described in more detail herein and with respect to FIG. 5.

A second dynamic reference technique (which may also be referred to as a counter-based technique) may be similar to the first dynamic reference technique except the target quantity for setting $V_{REF0}$ may be the total quantity of cells for State A (e.g., as defined by the target distribution). Once the target quantity of ternary cells in State A is reached, the memory device may set the level of $V_{REF0}$ to be the last voltage level used to read the ternary cells. A similar process may be used to set the level of $V_{REF1}$ based on the quantity of ternary cells in State B. Because the second dynamic reference technique may be more precise than the first dynamic reference technique in some ways, the second dynamic reference technique may be used with codewords that are more precisely weighted (e.g., codewords that are associated with the target distribution). The process for generating codewords compatible with the second dynamic reference technique may include a step for adding padding bits, as described in more detail herein and with respect to FIG. 5.

A third dynamic reference technique (which may also be referred to as a counter-based syndrome technique) may be similar to the second dynamic reference technique except the levels of $V_{REF0}$ and $V_{REF1}$ may be further adjusted based on any errors detected in the ternary cells. Because the third dynamic reference technique involves error detection for reading at $V_{REF0}$ as well as error detection for reading at $V_{REF1}$, the third dynamic reference technique may be used with two fixed weight codewords as described in more detail herein and with respect to FIG. 3. One of the fixed weight codewords may be constructed so that syndrome feedback is provided when the ternary cells are read using $V_{REF0}$ and the other fixed weight codeword may be constructed so that syndrome feedback is provided when the ternary cells are read using $V_{REF1}$. Padding bits may be added to the codewords to ensure that the codewords are precisely balanced.

Although described with reference to ternary memory cells that are programmable to three states, the techniques described herein may be implemented using other types of memory cells that are programmable to other, different quantities of states.

The codewords discussed herein may be generated based on a coding scheme such as the coding scheme 205, which may map multiple data bits (e.g., three data bits) to two ternary cells (e.g., denoted cell i and cell j). For ease of reference, the three data bits are denoted x, y, and z. According to the coding scheme 205, the eight possible values of the three (x, y, z) bits may be mapped to eight of the nine possible state combinations of cell i and cell j. In FIG. 2, the states of cell i are denoted Ai, Bi, and Ci, the states of cell j are denoted Aj, Bj, and Cj, and each box represents one possible value for the (x, y, z) bits. The combination of states (Ai, Aj) is not used in the coding scheme 205, which may allow the memory device to equate the logic value of bit x with the quantity of cells in State A as described below.

The coding scheme 205 may be chosen so that bit x has a logic value of logic one when either cell is in State A and so that bit x has a logic value of logic zero if neither cell is in State A. So, the logic value of bit x may be equal to the quantity of cells in State A. Because State A is detected using $V_{REF0}$, such a mapping may enable syndrome feedback for a codeword at $V_{REF0}$ (e.g., if the codeword's data bits are exclusively x bits), which in turn may enable the third dynamic reference scheme. For example, the memory device may generate a codeword (referred to as codeword(x)) using the x bits from multiple sets of data so that reading the codeword using $V_{REF0}$ results in syndrome bits that can be used to detect one or more errors in the codeword. To enable error detection for $V_{REF1}$ reading, the memory device may generate a second codeword (referred to as codeword(y, z)) using the y bits and z bits from the sets of data.

The coding scheme 205 may also be chosen so that if the x bit is a logic zero, inversion of a y bit or a z bit (but not both) is associated with a transition between State B and State C for one of the cells. Put another way, grey coding may be used for the (y, z) logic values associated with an x bit that is logic zero. Grey coding these particular logic values combinations (illustrated by the dashed oval) may allow the memory device to modify the B and C states of codeword(y, z) by inverting the y and z bits in codeword(y, z) (e.g., during a balancing process). As illustrated in FIG. 2, other logic value combinations may also be grey coded (e.g., to limit the quantity of bit errors introduced by a state error, as discussed below).

In some examples, the coding scheme 205 may be chosen so that a state error for one of the cells results in at most two bit errors. Put another way, the coding scheme 205 may be such that if the state of one of the cells changes (e.g., inadvertently changes), two or fewer bit errors occur. This can be seen looking at the coding scheme 205, where each transition between boxes (e.g., a state error) results in a single bit changing value. The two exceptions may be 1) the transition between (Bj, Ai) and (Bj, Bi) and 2) the transition between (Cj, Ai) and (Cj, Bi), each of which may result in two bits changing value. Although such exceptions to grey coding may not be possible to avoid, the coding scheme 205 may be chosen so that the two bits in error are distributed between codeword(x) and codeword(y, z) (as opposed to being consolidated in either codeword). Consider, for example, an erroneous transition between (Bj, Ai) and (Bj, Bi), which results in errors in the x bit (which is in codeword(x)) and the z bit (which is in codeword(y, z)). Ensuring distribution of the errors among both codewords may allow the memory device to use a lower power ECC than may otherwise be permitted. For example, the memory device may use an ECC power that is capable of detecting a single error per codeword, as opposed to an ECC power that is capable of detecting multiple errors per codeword.

Although the coding scheme 205 provides an example mapping of bit logic values to combinations of ternary cell states—which may be associated with various advantages—other coding schemes with suitable mappings may be used to generate fixed weight codewords as described herein. For example, the techniques described herein may be used with a variety of coding schemes that map 1.5 bits to a cell or that map n bits to a cell, where n is an integer or a rational number. However, to aid illustration, various examples may be described with reference to the coding scheme 205.

Figure 3:
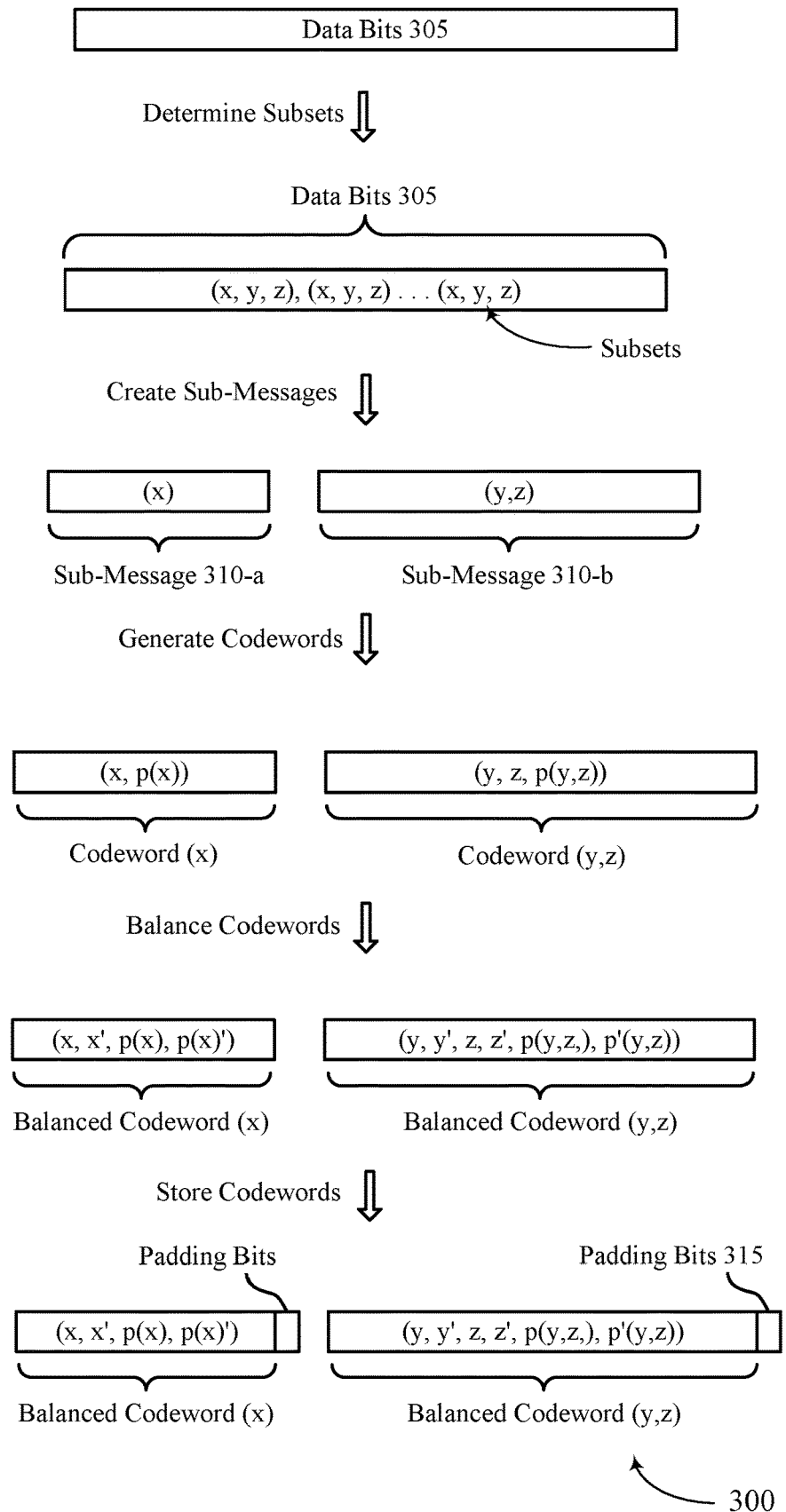
FIG. 3 illustrates an example of a storage process that supports fixed weight codewords for ternary memory cells in accordance with examples as disclosed herein.

FIG. 3 illustrates an example of a storage process 300 that supports fixed weight codewords for ternary memory cells in accordance with examples as disclosed herein. A memory device may implement the storage process 300 to generate multiple fixed weight codewords (e.g., codeword(x) and codeword(y, z)) for use with the third dynamic reference technique as described herein. The codewords may be precisely weighted, which may mean that the codewords are associated with state distributions that are equal to target distributions.

The memory device may receive a set of data bits 305 for storage in an array of ternary cells. The memory device may divide (e.g., logically or physically) the data bits 305 into subsets of (x, y, z) bits for storage in respective pairs of ternary cells according to a coding scheme such as the coding scheme 205. Put another way, the memory device may assign the data bits 305 to groups of x bits, y bits, and z bits. If the quantity of x bits is different than the quantity of y bits (or z bits) (e.g., a discrepancy that may allow the memory device to minimize the quantity of ternary cells used to the store the codewords), the memory device may divide the data bits 305 into some subsets of (x, y, z) bits and some subsets of (y, z) bits (e.g., if there are more y bits and z bits than x bits) or the memory device may divide the data bits 505 into some subsets of (x, y, z) bits and some subsets of (x) bits (e.g., if there are more x bits than y bits and z bits).

The memory device may form a first sub-message 310-a that includes the x bits of the subsets and may form a second sub-message 310-b that includes the y bits and z bits of the subsets. Forming a sub-message may refer to communicating the data bits of the sub-message to an ECC encoder for ECC encoding.

The memory device may generate a first codeword (e.g., codeword(x)) from sub-message 310-a and may generate a second codeword (e.g., codeword(y, z)) from sub-message 310-b. The memory device may generate codeword(x) by encoding the first sub-message 310-a with an ECC code (which may include applying an ECC code to the x bits of the first sub-message 310-a). Codeword(x) may include the x bits from the subsets and parity bits (denoted (p(x)) that are based on the x bits. Because the bits in codeword(x) can be detected using $V_{REF0}$ (due to the coding scheme 205), the memory device may use codeword(x) to detect errors when $V_{REF0}$ is used to read the ternary cells, which in turn may allow the memory device to select a more precise value for $V_{REF0}$ compared to other techniques. For example, the memory device may select the value for $V_{REF0}$ to account for a state error that would otherwise cause the memory device to set the value for $V_{REF0}$ too low or too high.

The memory device may generate codeword(y, z) by encoding the second sub-message 310-b with the ECC code (which may include applying the ECC code to the (y, z) bits of the second sub-message 310-a). Codeword(y) may include the (y, z) bits and parity bits (denoted (p(y, z)) that are based on the (y, z) bits. Because the bits in codeword(y, z) can be detected using $V_{REF1}$ (due to the coding scheme 205), the memory device may use codeword(y, z) to detect errors when $V_{REF1}$ is used to read the ternary cells, which in turn may allow the memory device to select a more precise value for $V_{REF1}$ compared to other techniques. For example, the memory device may select the value for $V_{REF1}$ to account for a state error that would otherwise cause the memory device to set the level for $V_{REF1}$ too low or high. It should be appreciated that the parity bits for the codewords may be encoded to multi-level (e.g., ternary) cells similar to the data bits 305 (e.g., using the coding scheme 205). Further, the parity bits for codeword(x) (denoted p(x)) may be coded as x bits so that the parity bits p(x) can be determined by $V_{REF0}$. And the parity bits for codeword(y, z) (denoted p(y, z)) may be coded as (y, z) bits so that the parity bits p(y, z) can be determined by $V_{REF1}$.

Codeword(x) and codeword(y, z) may be of different lengths, so a same or different ECC engine may be used to generate the codewords. If different ECC engines are used, the codewords may be protected against different quantities of errors (e.g., codeword(x) may be protected against 1-bit errors and codeword(y, z) may be protected against 2-bit errors).

The memory device may packetize codeword(x), which may involve logically forming packets of the x bits and p(x) bits such that inversion of one or more of the packets during a subsequent balancing process does not disrupt the efficacy of the ECC for codeword(x). The memory device may also packetize codeword(y, z), which may involve logically forming packets of the y bits, z bits, and p(y, z) bits such that inversion of one or more of the packets during a subsequent balancing process does not disrupt the efficacy of the ECC for codeword(y, z). The size or dimension of a packet of a codeword may refer to the quantity of bits in that packet. Some or all of the packets of a codeword may have uniform dimensions or different dimensions.

The memory device may perform a balancing process in which the memory device balances codeword(x) and codeword(y, z).

The memory device may balance codeword(x) by inverting one or more packets of codeword(x). Inverting a packet may refer to inverting the bits of the packet (e.g., changing logic zeros to logic ones, and vice versa). The memory device may balance codeword(x) based on the coding scheme 205 and a target distribution for codeword(x). After the inversion, codeword(x) may include one or more x bits and parity bits that have been inverted (denoted with a prime symbol in FIG. 3). The memory device may invert the packets of codeword(x) so that the target distribution of states is reached. For example, the memory device may invert the packets of codeword(x) so that 50% of the bits in codeword(x) are logic ones. So, after the inversion process, 50% of the states associated with codeword(x) may be State A, 25% of the states may be State B, and 25% of the states may be State C (due to the coding scheme 205). Thus, the memory device may invert a portion of codeword(x) so that codeword(x) has a fixed weight.

The memory device may balance codeword(y, z) by inverting one or more packets of codeword(y, z). The memory device may balance codeword(y, z) based on the coding scheme 205 and a target distribution for codeword(y, z). After the inversion, codeword(y, z) may include one or more y bits, z bits, and parity bits that have been inverted (denoted with a prime symbol in FIG. 3). The memory device may invert the packets of codeword(y, z) so that the target distribution of states is reached. For example, the memory device may invert the packets of codeword(y, z) so that 50% of the states associated with codeword(y, z) are State B and 50% of the states are State C. Thus, the memory device may invert a portion of codeword(y, z) so that codeword(y, z) has a fixed weight.

After balancing the codewords, the memory device may store the balanced codewords in the array of ternary cells. For example, memory device may store codeword(x) and codeword(y, z) in a set of the ternary cells according to the coding scheme 205. Thus, in one example, 25% the ternary cells may be in State A, 37.5% of the ternary cells may be in State B, and 37.5% of the ternary cells may be in State C.

In some examples, the memory device may add one or more padding bits 315 to the codewords to reach the target distributions. For example, if less than 50% of the states associated with codeword(x) are State A, the memory device may add an appropriate quantity of padding bits set to logic one to resolve the difference between the target quantity for State A and the actual quantity for State A. The memory device may additionally or alternatively add padding bits to codeword(y, z) to ensure that codeword(y, z) is associated with the target quantity of B states (e.g., equal to 37.5% of the total states). A codeword that has the target distribution of states may be referred to as precisely weighted and a codeword that does not have the target distribution (but that is within a threshold range of the target distribution) may be referred to as imprecisely weighted. The ability of a memory device to precisely weight a codeword using balancing alone may be related to the packet size used for the codeword, with smaller packet sizes enabling higher precision relative to larger packet sizes.

In some examples, the memory device may optimize or improve the storage process 300 by selecting quantities of x bits, y bits, and z bits so that the quantity of ternary cells used to store the codewords is minimized or reduced. For ease of reference the quantity of x bits may be referred to as $D_X$ (or the payload of codeword(x)) and the sum quantity of y bits and z bits may be referred to as $D_{YZ}$ (or the payload of codeword(y, z)). Additionally, the sum quantity of parity bits of codeword (x) may be referred to a $P_X$ and the sum quantity of parity bits of codeword(y, z) may be referred to as $P_{YZ}$. $P_X$ and $P_{YZ}$ may be defined by the total payload (e.g., $D_X+D_{YZ}$) for codeword(x) and codeword(y, z), the ECC protection level, or both. To reduce the quantity of ternary cells used to store the codewords, the memory device may select $D_X$ and $D_{YZ}$ so that the quantity of ternary cells for storing codeword(x) (referred to as $Q_X$) is equal to the quantity of ternary cells for storing codeword(y, z) (referred to as $Q_{YZ}$).

According to the coding scheme 205, two ternary cells may define (e.g., represent, be associated with, indicate) a single bit of codeword(x) and two ternary cells may define two bits of codeword(y, z). So, the quantity of ternary cells for storing codeword(x) (e.g., $Q_X$) may be equal to $2(D_X+C_{ECC} \cdot P_X)$ and the quantity of ternary cells for storing codeword(y, z) (e.g., $Q_{YZ}$) may be equal to $(Dy+C_{ECC} \cdot P_{YZ})$, where $C_{ECC}$ is an ECC coefficient. By setting $Q_X$ equal to $Q_{YZ}$, the memory device may calculate $D_X$ and $D_{YZ}$. For example, given ECC3 (an ECC protection level that can correct up to three errors), the memory device may calculate $D_X$ and $D_{YZ}$ by solving $2(D_X+3P_X)=(D_{YZ}+3P_{YZ})$, where $D_X+D_{YZ}$ is the total payload and 3 is the ECC coefficient for ECC3. As an illustration, given a total payload of 512 bits, with $P_{YZ}=9$ and $P_X=8$, $D_X$ may be equal to 164 bits, $D_{YZ}$ may be equal to 348 bits, and $Q_Z$ and $Q_{YZ}$ may be equal to 376. So, the quantity of x bits may be less than the quantity of sum quantity of (y, z) bits. Further, the quantity of y bits may be equal to the quantity of z bits.

Thus, the quantity of bits in codeword(x) and codeword(y, z) may be different but the quantity of ternary cells used to store the codewords may be the same, which may reduce overhead. If padding bits are used, the memory device may modify one or more of the calculations described herein to account for the padding bits.

Figure 4:
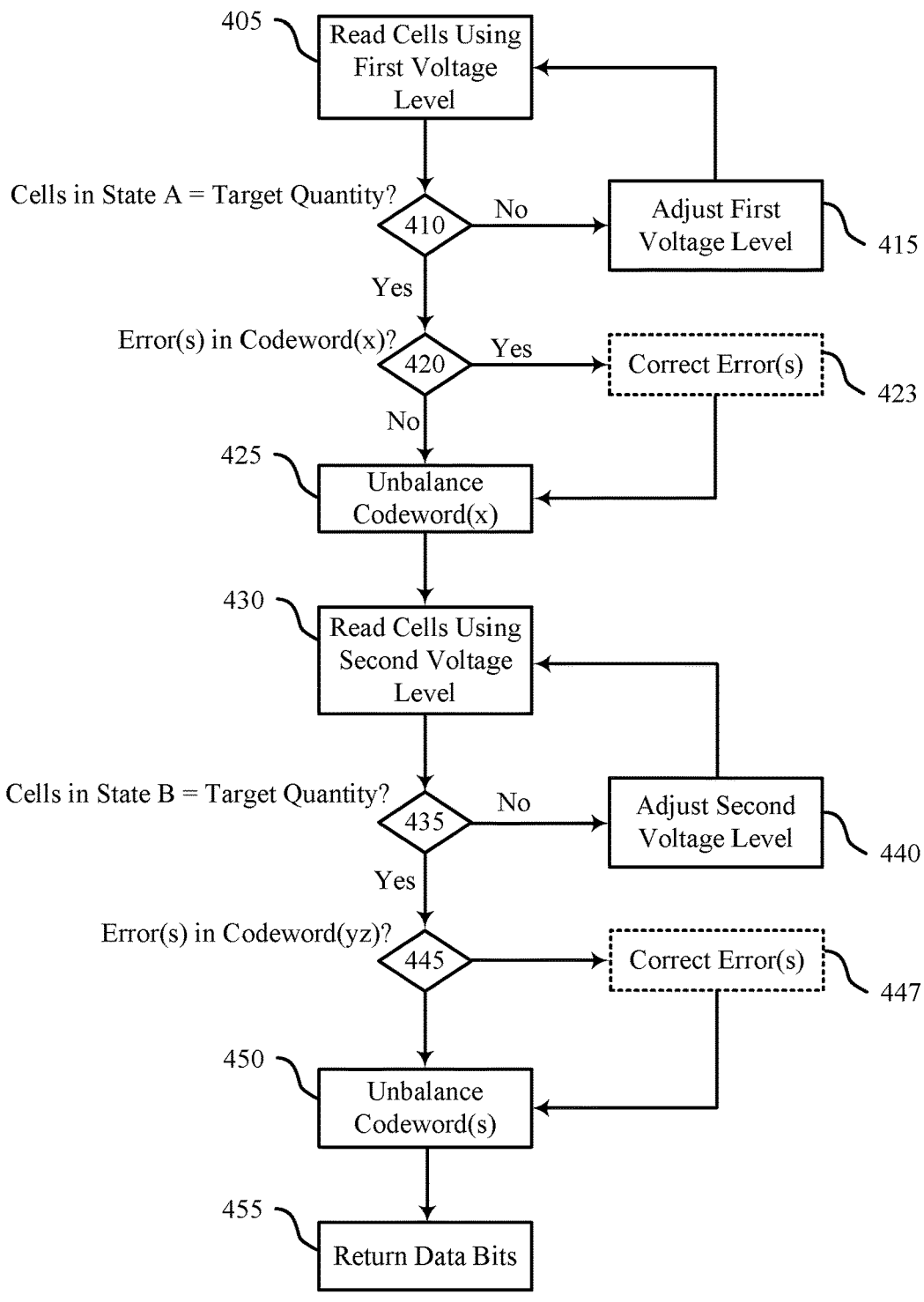
FIG. 4 illustrates an example of a retrieval process that supports fixed weight codewords for ternary memory cells in accordance with examples as disclosed herein.

FIG. 4 illustrates an example of a retrieval process 400 that supports fixed weight codewords for ternary memory cells in accordance with examples as disclosed herein. A memory device may implement the retrieval process 400 to set reference voltages, such as $V_{REF0}$ and $V_{REF1}$, using the third dynamic reference technique described herein. The retrieval process 400 may be performed using multiple fixed weight codewords (e.g., codeword(x) and codeword(y, z)) generated according to the storage process 300. The memory device may implement the retrieval process 400 in response to a request from another device (e.g., a host device) for the data bits 305.

At 405, the memory device may read a set of ternary cells that stores codeword(x) and codeword(y, z). The memory device may read the set of ternary cells using a first voltage level (e.g., the memory device may apply the first voltage level to the set of ternary cells). The memory device may determine how many cells are in State A based on reading the set of ternary cells using the first voltage level. The quantity of cells in State A may be equal the quantity of bits with logic values equal to logic one, per the coding scheme 205.

At 410, the memory device may determine whether the quantity of ternary cells in State A is equal to the target quantity for State A (e.g., as defined by the target distribution of states for codeword(x)). The memory device may determine whether the quantity of ternary cells in State A is equal to the target quantity for State A by comparing the quantity of ternary cells in State A with the target quantity for State A.

If, at 410, the quantity of ternary cells in State A is determined to be different (e.g., less than) than the target quantity for State A, the memory device may proceed to 415 and adjust the first voltage level. The memory device may then repeat the operations at 405 and 410 using the adjusted first voltage level. If, at 410, the quantity of ternary cells in State A is determined to be equal to the target quantity for State A, the memory device may proceed to 420.

At 420, the memory device may perform an ECC decoding process to detect any errors in codeword(x). For example, the memory device may perform an ECC decoding process using syndrome bits that are based on the codeword (x) and the ECC used to generate codeword(x). If the memory device detects one or more errors in codeword(x), the memory device may correct the error(s) at 423 before proceeding to 425.

In some cases, after 423, the memory device may set $V_{REF0}$. For example, the memory device may select a level for $V_{REF0}$. The memory device may select the level for $V_{REF0}$ based on the first voltage level (e.g., the voltage level used to reach the target quantity for State A). The memory device may also select the level for $V_{REF0}$ based on any errors detected at 420. For example, the memory device may select an initial level for $V_{REF0}$ based on the first voltage level, then adjust the level for $V_{REF0}$ up or down based on the presence or absence of an error in codeword(x). In some examples, the adjustment of $V_{REF0}$ may be based on the quantity of errors detected at 420 (e.g., the magnitude of the adjustment may be proportional to the quantity of errors). In some examples, the operations at 420 and 423 may occur before the operations at 410.

At 425, the memory device may unbalance codeword(x). Unbalancing a codeword may refer to the inversion of one or more packets of the codeword to restore the original logic values of the bits in those packets. In some examples, the memory device may unbalance codeword(x) based on balancing information bits that indicate the packets (e.g., portions) of codeword(x) that were inverted during the balancing process.

At 430, the memory device may read the set of ternary cells that stores codeword(x) and codeword(y, z). The memory device may read the set of ternary cells using a second voltage level (e.g., the memory device may apply the second voltage level to the set of ternary cells). The second voltage level may be lower or higher than $V_{REF0}$ depending on the technology of the memory device. The memory device may determine how many cells are in State B (or state C, depending on the memory cell technology) based on reading the set of ternary cells using the second voltage level.

At 435, the memory device may determine whether the quantity of ternary cells in State B is equal to the target quantity for State B (e.g., as defined by the target distribution of states for codeword(y, z)). The memory device may determine whether the quantity of ternary cells in State B is equal to the target quantity for State B by comparing the quantity of ternary cells in State B with the target quantity for State B.

If, at 435, the quantity of ternary cells in State B is determined to be different than the target quantity for State B, the memory device may proceed to 440 and adjust the second voltage level. The memory device may then repeat the operations at 430 and 435 using the adjusted second voltage level. If, at 435, the quantity of ternary cells in State B is determined to be equal to the target quantity for State B, the memory device may proceed to 445.

At 445, the memory device may perform an ECC decoding process to detect any errors in codeword(y, z). For example, the memory device may perform an ECC decoding process using syndrome bits that are based on 1) the codeword(y, z) and 2) the ECC used to generate codeword(y, z). Codeword(x) and codeword(y, z) may be of different lengths, so a same or different ECC engine may be used to decode the codewords. If the memory device detects one or more errors in codeword(y, z), the memory device may correct the error(s) at 447 before proceeding to 450.

In some cases, after 447, the memory device may set $V_{REF1}$. For example, the memory device may select a level for $V_{REF1}$. The memory device may select the level for $V_{REF1}$ based on the second voltage level (e.g., the voltage level used to reach the target quantity for State B). The memory device may also select the level for $V_{REF1}$ based on any errors detected at 445. For example, the memory device may select an initial level for $V_{REF1}$ based on the second voltage level, then adjust the level for $V_{REF1}$ up or down based on the presence or absence of an error in codeword(y, z). In some examples, the adjustment of $V_{REF1}$ may be based on the quantity of errors detected at 445 (e.g., the magnitude of the adjustment may be proportional to the quantity of errors). In some examples, the operations at 445 and 447 may occur before the operations at 435.

At 450, the memory device may unbalance codeword(y, z). In some examples, the memory device may also unbalance codeword(x) at 450 (e.g., instead of unbalancing codeword(x) at 425). In some examples, the memory device may unbalance codeword(y, z) based on balancing information bits that indicate the packets (e.g., portions) of codeword(y, z) that were inverted during the balancing process. At 465, the memory device may return (e.g., communicate) the data bits 305 to the device the requested the data bits 305.

Thus, the memory device may use the third dynamic reference technique—and multiple fixed weight codewords—to set $V_{REF0}$ and $V_{REF1}$. Although described with reference to ternary memory cells and two reference voltages, the techniques described herein and with respect to FIGS. 3 and 4 can be implemented using any type of memory cell and any quantity of reference voltages. For example, the techniques described herein may be implemented using three reference voltages and memory cells that are programmable to four states.

Figure 5:
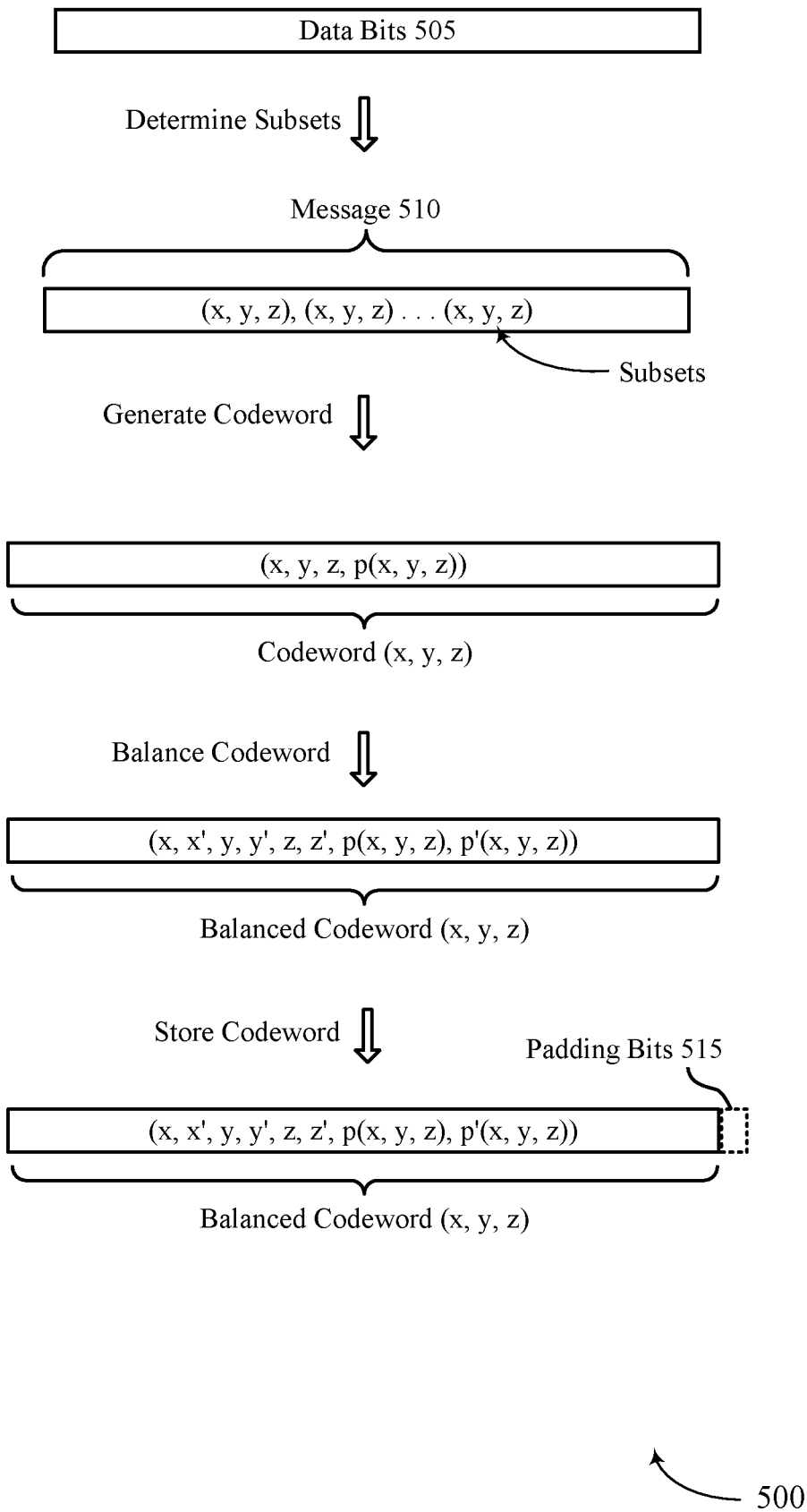
FIG. 5 illustrates an example of a storage process that supports fixed weight codewords for ternary memory cells in accordance with examples as disclosed herein.

FIG. 5 illustrates an example of a storage process 500 that supports fixed weight codewords for ternary memory cells in accordance with examples as disclosed herein. A memory device may implement the storage process 500 to generate multiple fixed weight codewords (e.g., codeword(x) and codeword(y, z)) for use with the first dynamic reference technique or the second dynamic reference technique as described herein.

The memory device may receive a set of data bits 505 for storage in an array of ternary cells. The memory device may divide (e.g., logically or physically) the data bits 505 into subsets of (x, y, z) bits for storage in respective pairs of ternary cells according to a coding scheme such as the coding scheme 205. If the quantity of x bits is different than the quantity of y bits (or z bits) (which may allow the memory device to minimize the quantity of ternary cells used to the store the codeword), the memory device may divide the data bits 505 into some subsets of (x, y, z) bits and some subsets of (y, z) bits (e.g., if there are more y bits and z bits than x bits) or the memory device may divide the data bits 505 into some subsets of (x, y, z) bits and some subsets of (x) bits (e.g., if there are more x bits than y bits and z bits).

The memory device may form a message 510 the x bits, y bits, and z bits of the subsets. Forming a message may refer to communicating the data bits of the message to an ECC encoder for ECC encoding. The memory device may generate a codeword (e.g., codeword(x, y, z)) from message 510. The memory device may generate codeword(x, y, z) by encoding the message 510 with an ECC code (which may include applying an ECC code to the (x, y, z) bits of the message 410). Codeword(x, y, z) may include the (x, y, z) bits from the subsets and parity bits (denoted (p(x, y, z)) that are based on the (x, y, z) bits.

The memory device may packetize codeword(x, y, z), which may involve logically forming packets of the (x, y, z) bits and p(x, y, z) bits such that inversion of one or more of the packets during a subsequent balancing process does not disrupt the efficacy of the ECC for codeword(x, y, z).

The memory device may balance codeword(x, y, z) by inverting one or more packets of codeword(x, y, z). The memory device may balance codeword(x, y, z) based on the coding scheme 205 and a target distribution for codeword(x, y, z). After the inversion, codeword(x, y, z) may include one or more x bits, y bits, z bits, and parity bits that have been inverted (denoted with prime symbols in FIG. 5). The memory device may invert the packets of codeword(x, y, z) so that the target distribution of states is reached. For example, the memory device may invert the packets of codeword(x, y, z) so that 25% of the states associated with codeword(x) are State A, 37.5% of the states are State B, and 37.5% of the states are State C. Thus, the memory device may invert a portion of codeword(x, y, z) so that codeword (x, y, z) has a fixed weight.

After balancing codeword (x, y, z), the memory device may store the balanced codeword in the array of ternary cells. For example, memory device may store codeword(x, y, z) in a set of the ternary cells according to the coding scheme 205. Thus, in one example, 25% the ternary cells may be in State A, 37.5% of the ternary cells may be in State B, and 37.5% of the ternary cells may be in State C.

In some examples, balancing codeword(x, y, z) may result in an imprecisely weighted codeword. If the memory device is using the first dynamic reference technique, the memory device may store the imprecisely weighted codeword in the ternary cells without adding padding bits (e.g., because the first dynamic reference technique may be as effective with or without a precisely weighted codeword). If the memory device is using the second dynamic reference technique, the memory device may add one or more padding bits 515 to codeword(x, y, z) (e.g., because the efficacy of the second dynamic reference technique may be based on the precision of codeword(x, y, z)).

In some examples, the memory device may optimize or improve the storage process 500 by selecting quantities of x bits, y bits, and z bits so that the quantity of ternary cells used to store the codewords is minimized or reduced, as described with reference to the storage process 300.

Figure 6:
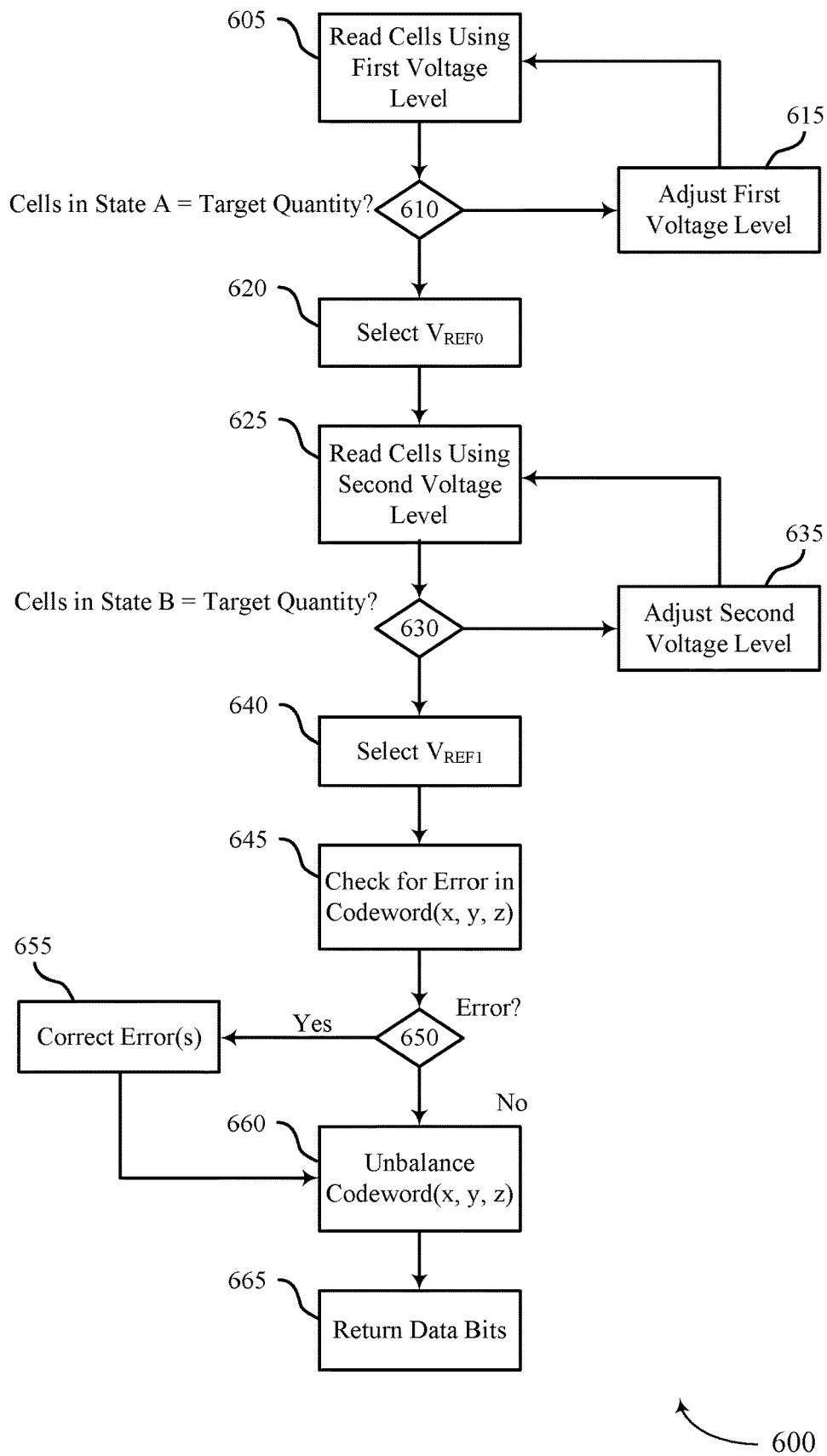
FIG. 6 illustrates an example of a retrieval process that supports fixed weight codewords for ternary memory cells in accordance with examples as disclosed herein.

FIG. 6 illustrates an example of a retrieval process 600 that supports fixed weight codewords for ternary memory cells in accordance with examples as disclosed herein. A memory device may implement the retrieval process 600 to set reference voltages, such as $V_{REF0}$ and $V_{REF1}$, using the first dynamic reference technique or the second dynamic reference technique described herein. The retrieval process 600 may be performed using a fixed weight codeword (e.g., codeword(x, y, z)) generated according to the storage process 500. The memory device may implement retrieval process 600 in response to a request from another device (e.g., a host device) for the data bits 505.

At 605, the memory device may read a set of ternary cells that stores codeword(x, y, z). The memory device may read the set of ternary cells using a first voltage level (e.g., the memory device may apply the first voltage level to the set of ternary cells). The memory device may determine how many cells are in State A based on reading the set of ternary cells using the first voltage level. The quantity of cells in State A may be equal the quantity of bits with logic values equal to logic one, per the coding scheme 205.

At 610, the memory device may determine whether the quantity of ternary cells in State A is equal to the target quantity for State A (as defined by the target distribution of states for codeword(x, y, z)). The memory device may determine whether the quantity of ternary cells in State A is equal to the target quantity for State A by comparing the quantity of ternary cells in State A with the target quantity for State A.

If, at 610, the quantity of ternary cells in State A is determined to be different than the target quantity for State A, the memory device may proceed to 615 and adjust the first voltage level. The memory device may then repeat the operations at 605 and 610 using the adjusted first voltage level. If, at 610, the quantity of ternary cells in State A is determined to be equal to the target quantity for State A, the memory device may proceed to 620.

At 620, the memory device may set $V_{REF0}$. For example, the memory device may select a level for $V_{REF0}$. The memory device may select the level for $V_{REF0}$ based on the first voltage level (e.g., the voltage level used to reach the target quantity of State A). If the memory device is using the first dynamic reference technique, the memory device may select the level for $V_{REF0}$ to be equal to the first voltage level plus a margin. If the memory device is using the second dynamic reference technique, the memory device may select the level for $V_{REF0}$ to be equal to the first voltage level.

At 625, the memory device may read the set of ternary cells that stores codeword(x, y, z). The memory device may read the set of ternary cells using a second voltage level (e.g., the memory device may apply the second voltage level to the set of ternary cells). The second voltage level may be higher than $V_{REF0}$. The memory device may determine how many cells are in State B based on reading the set of ternary cells using the second voltage level.

At 630, the memory device may determine whether the quantity of ternary cells in State B is equal to the target quantity for State B (as defined by the target distribution of states for codeword(x, y, z)). The memory device may determine whether the quantity of ternary cells in State B is equal to the target quantity for State B by comparing the quantity of ternary cells in State B with the target quantity for State B.

If, at 630, the quantity of ternary cells in State B is determined to be different than the target quantity for State B, the memory device may proceed to 635 and adjust the second voltage level. The memory device may then repeat the operations at 625 and 630 using the adjusted second voltage level. If, at 630, the quantity of ternary cells in State B is determined to be equal to the target quantity for State B, the memory device may proceed to 640.

At 640, the memory device may set $V_{REF1}$. For example, the memory device may select a level for $V_{REF1}$. The memory device may select the level for $V_{REF1}$ based on the second voltage level (e.g., the voltage level used to reach the target quantity of State B). If the memory device is using the first dynamic reference technique, the memory device may select the level for $V_{REF1}$ to be equal to the second voltage level plus a margin. If the memory device is using the second dynamic reference technique, the memory device may select the level for $V_{REF1}$ to be equal to the second voltage level.

At 645, the memory device may perform an ECC decoding process to detect an error in codeword(x, y, z). For example, the memory device may perform an ECC decoding process using syndrome bits that are based on 1) the codeword(x, y, z) and 2) the ECC used to generate codeword(x, y, z). At 650, the memory device may determine whether there are any errors in codeword(x, y, z). The memory device may determine whether there are any errors based on the decoding process performed at 645.

If, at 650, the memory device detects one or more errors in codeword(x, y, z), the memory device may proceed to 655 and correct the error(s) detected in codeword(x, y, z). If, at 650, the memory device does not detect one or more errors in codeword(x, y, z), the memory device may proceed to 660 and unbalance codeword(x, y, z). In some examples, the memory device may unbalance codeword(x, y, z) based on balancing information bits that indicate the packets (e.g., portions) of codeword(x, y, z) that were inverted during the balancing process. At 665, the memory device may return (e.g., communicate) the data bits 505 to the device the requested the data bits 505.

Thus, the memory device may use the first dynamic reference technique or the second dynamic reference technique—and a fixed weight codeword—to set $V_{REF0}$ and $V_{REF1}$. Although described with reference to ternary memory cells and two reference voltages, the techniques described herein and with respect to FIGS. 5 and 6 can be implemented using any type of memory cell and any quantity of reference voltages. For example, the techniques described herein may be implemented using three reference voltages and memory cells that are programmable to four states.

Figure 7:
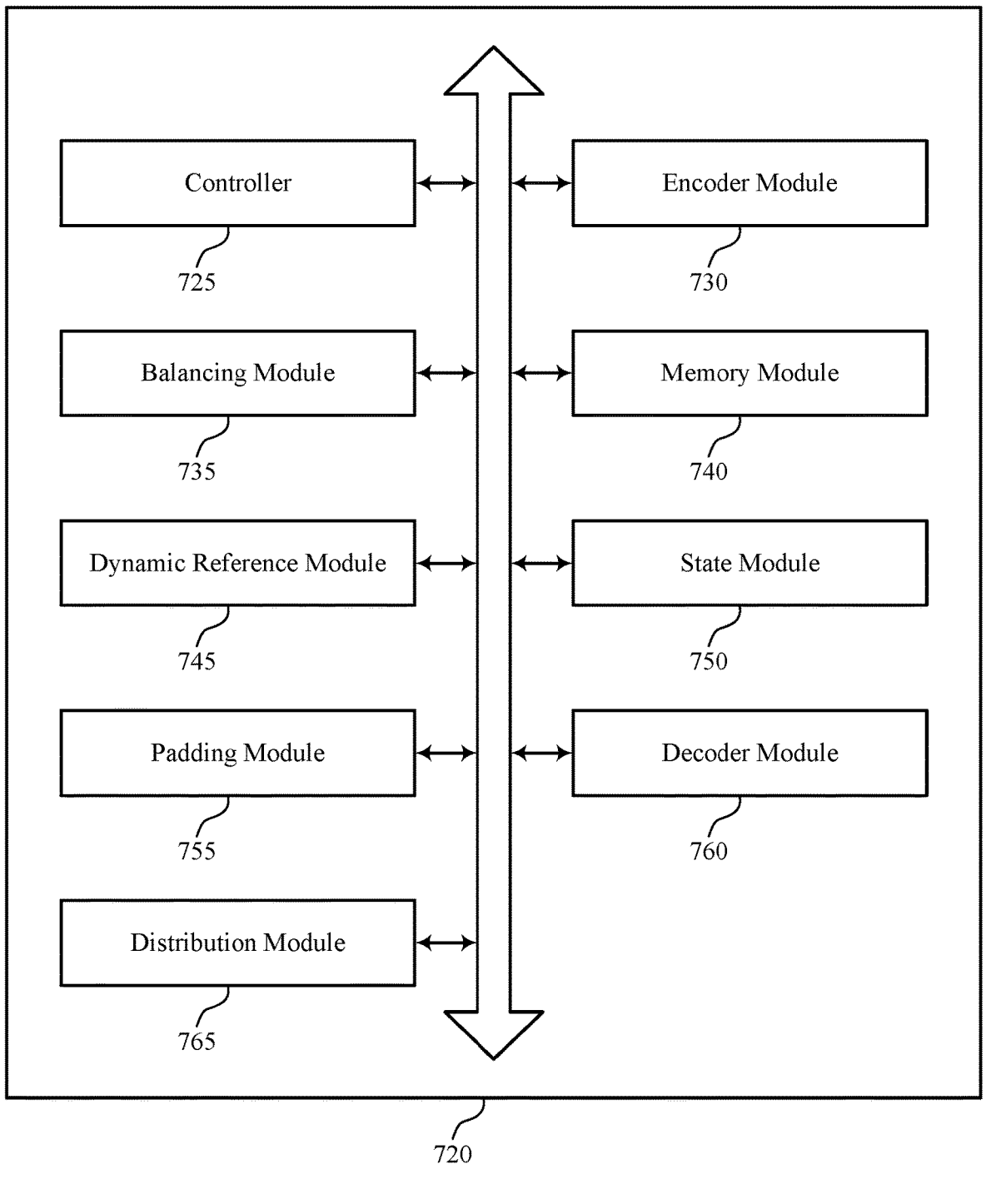
FIG. 7 shows a block diagram of a memory device that supports fixed weight codewords for ternary memory cells in accordance with examples as disclosed herein.

FIG. 7 shows a block diagram 700 of a memory device 720 that supports fixed weight codewords for ternary memory cells in accordance with examples as disclosed herein. The memory device 720 may be an example of aspects of a memory device as described with reference to FIGS. 1 through 6. The memory device 720, or various components thereof, may be an example of means for performing various aspects of fixed weight codewords for ternary memory cells as described herein. For example, the memory device 720 may include a controller 725, an encoder module 730, a balancing module 735, a memory module 740, a dynamic reference module 745, a state module 750, a padding module 755, a decoder module 760, a distribution module 765, or any combination thereof. Each of these components may communicate, directly or indirectly, with one another (e.g., via one or more buses).

The controller 725 may be configured as or otherwise support a means for dividing a set of received data bits into subsets of data bits for storage in respective pairs of ternary cells according to a coding scheme, each ternary cell programmable to a first state, a second state, or a third state. The encoder module 730 may be configured as or otherwise support a means for generating a first codeword that includes a first group of data bits including data bits from at least some of the subsets of data bits and a second codeword that includes a second group of data bits including data bits from each subset of data bits, where the first group and the second group include different data bits from the subsets of data bits. The balancing module 735 may be configured as or otherwise support a means for inverting a portion of the first codeword, a portion of the second codeword, or a portion of both codewords, based at least in part on the coding scheme and a respective target distribution of states for each codeword. The memory module 740 may be configured as or otherwise support a means for storing, after the inverting and according to the coding scheme, the first codeword and the second codeword in a set of ternary cells including the respective pairs of ternary cells.

In some examples, the padding module 755 may be configured as or otherwise support a means for adding one or more bits to the first codeword after the inverting and based at least in part on a difference between a distribution of states for the first codeword and the target distribution of states for the first codeword, where storing the first codeword is based at least in part on adding the one or more bits to the first codeword.

In some examples, the padding module 755 may be configured as or otherwise support a means for adding one or more bits to the second codeword after the inverting and based at least in part on a difference between a distribution of states for the second codeword and the target distribution of states for the second codeword, where storing the second codeword is based at least in part on adding the one or more bits to the second codeword.

In some examples, the controller 725 may be configured as or otherwise support a means for determining a first quantity of data bits to include in the first group of data bits for the first codeword based at least in part on the coding scheme and a quantity of parity bits for the first codeword, where the first group of data bits is based at least in part on the first quantity. In some examples, the first quantity of data bits is predetermined (e.g., a constant). In some examples, the controller 725 may be configured as or otherwise support a means for determining a second quantity of data bits to include in the second group of data bits for the second codeword based at least in part on the coding scheme and a quantity of parity bits for the second codeword, where the second group of data bits is based at least in part on the second quantity. In some examples, the second quantity of data bits is predetermined (e.g., a constant).

In some examples, the quantity of data bits for the first codeword is less than the quantity of the data bits for the second codeword (e.g., $D_X$ may be less than $D_{YZ}$). In some examples, the target distribution for the first codeword includes a target quantity for the first state. In some examples, the target distribution for the second codeword includes a target quantity for the second state and a target quantity for the third state.

In some examples, the state module 750 may be configured as or otherwise support a means for determining, based at least in part on reading the set of ternary cells using a first voltage level, a quantity of the set of ternary cells in the first state. In some examples, the dynamic reference module 745 may be configured as or otherwise support a means for selecting a level for a first reference voltage based at least in part on the target distribution and the quantity of the set of ternary cells in the first state.

In some examples, the state module 750 may be configured as or otherwise support a means for determining, for the first group of data bits in the first codeword, a quantity of data bits with a first logic value, where the quantity of the set of ternary cells in the first state is determined to be equal to the quantity of data bits with the first logic value.

In some examples, the state module 750 may be configured as or otherwise support a means for determining, based at least in part on reading the set of ternary cells using a second voltage level, a quantity of the set of ternary cells in the second state. In some examples, the dynamic reference module 745 may be configured as or otherwise support a means for selecting a level for a second reference voltage based at least in part on the target distribution and the quantity of the set of ternary cells in the second state.

In some examples, to support generating the first codeword, the encoder module 730 may be configured as or otherwise support a means for applying an error correction code to the first group of data bits. In some examples, to generate the second codeword, the encoder module 730 may be configured as or otherwise support a means for applying the error correction code to the second group of data bits.

In some examples, the memory module 740 may be configured as or otherwise support a means for reading, using a first voltage level, a first codeword and a second codeword from ternary cells in a memory array, each ternary cell programmable to store a first state, a second state, or a third state. The dynamic reference module 745 may be configured as or otherwise support a means for selecting a level for a first reference voltage based at least in part on the first voltage level and a quantity of the ternary cells in the first state. In some examples, the memory module 740 may be configured as or otherwise support a means for reading, using a second voltage level, the first codeword and the second codeword from the ternary cells. In some examples, the dynamic reference module 745 may be configured as or otherwise support a means for selecting a level for a second reference voltage based at least in part on the second voltage level and a quantity of the ternary cells in the second state.

In some examples, the memory module 740 may be configured as or otherwise support a means for determining a set of data bits from the first codeword and the second codeword and based at least in part on the first reference voltage and the second reference voltage. In some examples, the memory module 740 may be configured as or otherwise support a means for communicating the set of data bits to a requesting device.

In some examples, the state module 750 may be configured as or otherwise support a means for determining, for the first codeword, a quantity of data bits with a first logic value, where the quantity of the ternary cells in the first state is equal to the quantity of data bits with the first logic value.

In some examples, the decoder module 760 may be configured as or otherwise support a means for generating a set of syndrome bits for the first codeword based at least in part on reading the first codeword using the first voltage level. In some examples, the decoder module 760 may be configured as or otherwise support a means for determining that the first codeword has at least one error based at least in part on the set of syndrome bits, where the level for the first reference voltage is selected based at least in part on the at least one error.

In some examples, the decoder module 760 may be configured as or otherwise support a means for generating a set of syndrome bits for the second codeword based at least in part on reading the second codeword using the second voltage level. In some examples, the decoder module 760 may be configured as or otherwise support a means for determining that the second codeword has at least one error based at least in part on the set of syndrome bits, where the level for the second reference voltage is selected based at least in part on the at least one error.

In some examples, the distribution module 765 may be configured as or otherwise support a means for determining a target distribution of states by using the first codeword, the target distribution including a target quantity for the first state. In some examples, the target distribution is predetermined (e.g., a constant). In some examples, the distribution module 765 may be configured as or otherwise support a means for comparing the quantity of the ternary cells in the first state to the target quantity for the first state, where the level for the first reference voltage is selected based at least in part on the comparison.

In some examples, the distribution module 765 may be configured as or otherwise support a means for determining a target distribution of states by using the second codeword, the target distribution including a target quantity for the second state. In some examples, the target distribution is predetermined (e.g., a constant). In some examples, the distribution module 765 may be configured as or otherwise support a means for comparing the quantity of the ternary cells in the second state to the target quantity for the second state, where the level for the second reference voltage is selected based at least in part on the comparison.

In some examples, at least some of the pairs of ternary cells represent two bits from the second codeword or at least some of the pairs of ternary cells represent a bit from the first codeword.

In some examples, the controller 725 may be configured as or otherwise support a means for receiving a set of data bits for storage in a memory array including ternary cells, each ternary cell programmable to a first state, a second state, or a third state. In some examples, the controller 725 may be configured as or otherwise support a means for assigning each data bit of the set of data bits to one of plurality of groups associated with a coding scheme that maps a plurality of data bits to a pair of ternary cells. Alternatively, the assignment of data bits to groups may be performed by an assigner module (e.g., a collection of logic gates). In some examples, the encoder module 730 may be configured as or otherwise support a means for generating a codeword that includes subsets of data bits mapped to respective pairs of ternary cells, each subset including a data bit from two or more of the groups. In some examples, the balancing module 735 may be configured as or otherwise support a means for inverting a portion of the codeword based at least in part on the coding scheme a target distribution of states for the codeword. In some examples, the memory module 740 may be configured as or otherwise support a means for storing, after the inverting and according to the coding scheme, the codeword in a set of ternary cells.

In some examples, the padding module 755 may be configured as or otherwise support a means for adding one or more bits to the codeword after the inverting and based at least in part on a difference between a distribution of states for the codeword and the target distribution, where storing the codeword is based at least in part on adding the one or more bits to the codeword.

In some examples, the target distribution includes a quantity for the first state, a quantity for the second state, and a quantity for the third state. In some examples, the quantity for the second state is equal to the quantity for the third state and is greater than the quantity for the first state.

In some examples, the memory module 740 may be configured as or otherwise support a means for reading the codeword from the set of ternary cells using a first voltage level. In some examples, the dynamic reference module 745 may be configured as or otherwise support a means for selecting a level for a first reference voltage based at least in part on the target distribution and a quantity of the set of ternary cells in the first state.

In some examples, the memory module 740 may be configured as or otherwise support a means for reading the codeword from the set of ternary cells using a second voltage level. In some examples, the dynamic reference module 745 may be configured as or otherwise support a means for selecting a level for a second reference voltage based at least in part on the target distribution and a quantity of the set of ternary cells in the second state.

In some examples, the memory module 740 may be configured as or otherwise support a means for reading, using a first voltage level, a codeword from ternary cells in a memory array, each ternary cell programmable to a first state, a second state, or a third state. In some examples, the dynamic reference module 745 may be configured as or otherwise support a means for selecting a level for a first reference voltage based at least in part on the first voltage level and a quantity of the ternary cells in the first state. In some examples, the memory module 740 may be configured as or otherwise support a means for reading, using a second voltage level, the codeword from the ternary cells. In some examples, the dynamic reference module 745 may be configured as or otherwise support a means for selecting a level for a second reference voltage based at least in part on the second voltage level and a quantity of the ternary cells in the second state.

In some examples, the memory module 740 may be configured as or otherwise support a means for determining a set of data bits based at least in part on the first reference voltage and the second reference voltage. In some examples, the memory module 740 may be configured as or otherwise support a means for communicating the set of data bits to a requesting device.

In some examples, the distribution module 765 may be configured as or otherwise support a means for determining a target distribution of states by using the codeword, the target distribution including a target quantity for the first state. In some examples, the distribution module 765 may be configured as or otherwise support a means for comparing the quantity of the ternary cells in the first state to the target quantity for the first state, where the level for the first reference voltage is selected based at least in part on the comparison.

In some examples, the distribution module 765 may be configured as or otherwise support a means for determining a target distribution of states by using the codeword, the target distribution including a target quantity for the second state. In some examples, the target distribution may be predetermined (e.g., a constant). In some examples, the distribution module 765 may be configured as or otherwise support a means for comparing the quantity of the ternary cells in the second state to the target quantity for the second state, where the level for the second reference voltage is selected based at least in part on the comparison.

In some examples, the encoder module 730 may be configured as or otherwise support a means for generating a first codeword that includes a data bit from a subset of data bits and a second codeword that includes two data bits from the subset of data bits, the subset of data bits for storage in a pair of ternary cells according to a coding scheme. In some examples, the balancing module 735 may be configured as or otherwise support a means for inverting a portion of the first codeword based at least in part on the coding scheme and a target distribution of states for the first codeword, the target distribution including a target quantity for the first state. In some examples, the memory module 740 may be configured as or otherwise support a means for storing, after the inverting, the first and second codewords in a set of ternary cells according to the coding scheme. The state module 750 may be configured as or otherwise support a means for determining, based at least in part on reading the set of ternary cells using a voltage level, a quantity of the set of ternary cells in the first state. In some examples, the dynamic reference module 745 may be configured as or otherwise support a means for selecting a level for a first reference voltage based at least in part on the quantity of the set of ternary cells in the first state and the target quantity for the first state.

In some examples, the balancing module 735 may be configured as or otherwise support a means for inverting, before the storing, a portion of the second codeword based at least in part on the coding scheme and a second target distribution of states for the second codeword, the second target distribution including a target quantity for the second state.

In some examples, the state module 750 may be configured as or otherwise support a means for determining, based at least in part on reading the set of ternary cells using a second voltage level, a quantity of the set of ternary cells in the second state. In some examples, the dynamic reference module 745 may be configured as or otherwise support a means for selecting a level for a second reference voltage based at least in part on the quantity of the set of ternary cells in the second state and the target quantity for the second state.

Figure 8:
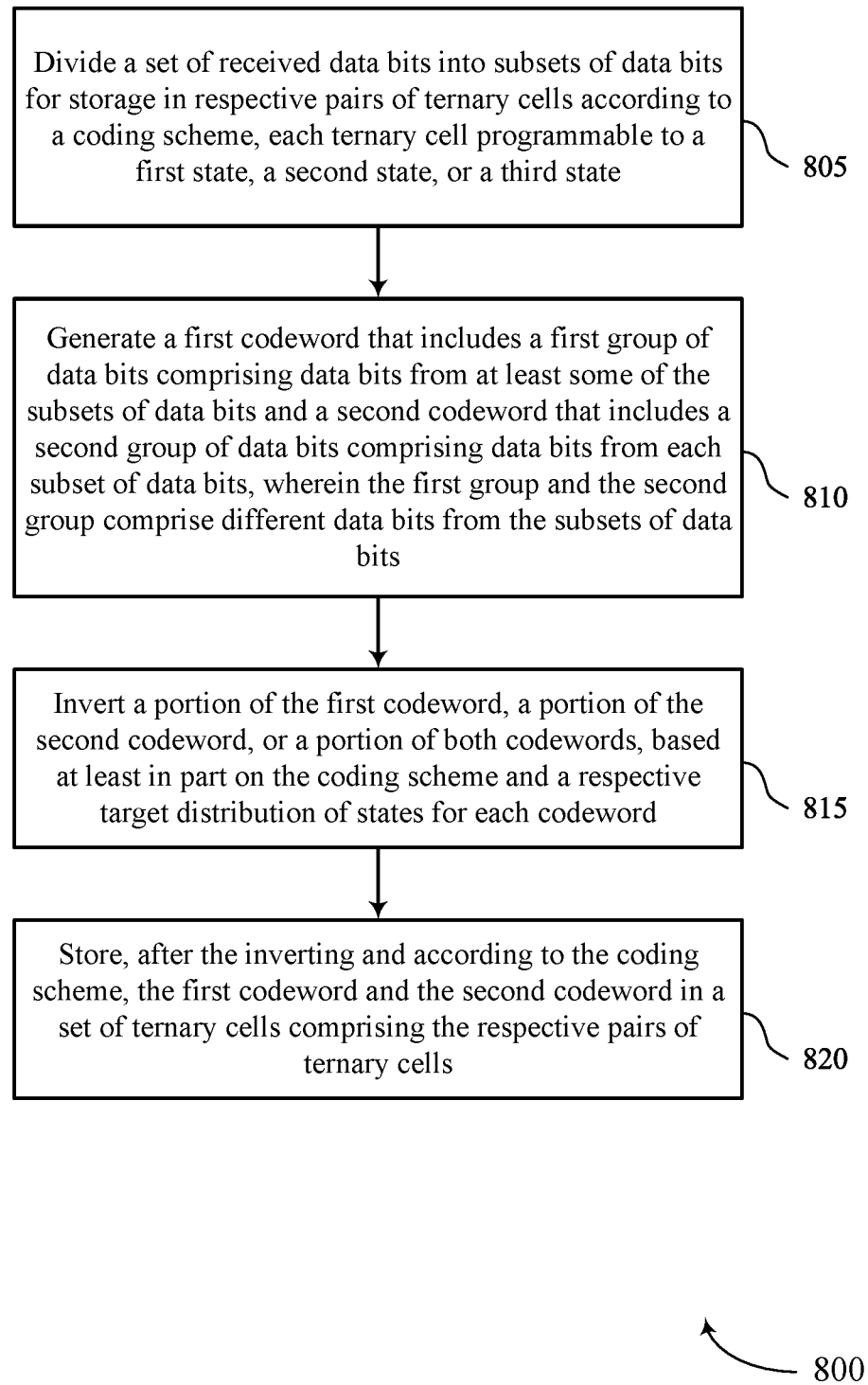
FIGS. 8 through 12 show flowcharts illustrating a method or methods that support fixed weight codewords for ternary memory cells in accordance with examples as disclosed herein.

FIG. 8 shows a flowchart illustrating a method 800 that supports fixed weight codewords for ternary memory cells in accordance with examples as disclosed herein. The operations of method 800 may be implemented by a memory device or its components as described herein. For example, the operations of method 800 may be performed by a memory device as described with reference to FIGS. 1 through 7. In some examples, a memory device may execute a set of instructions to control the functional elements of the device to perform the described functions. Additionally or alternatively, the memory device may perform aspects of the described functions using special-purpose hardware.

At 805, the method may include dividing a set of received data bits (e.g., data bits 305) into subsets of data bits for storage in respective pairs of ternary cells according to a coding scheme (e.g., coding scheme 205), each ternary cell programmable to a first state, a second state, or a third state. The operations of 805 may be performed in accordance with examples as disclosed herein. In some examples, aspects of the operations of 805 may be performed by a controller 725 as described with reference to FIG. 7.

At 810, the method may include generating a first codeword (e.g., codeword(x)) that includes a first group of data bits including data bits from at least some of the subsets of data bits and a second codeword (e.g., codeword(y, z,)) that includes a second group of data bits including data bits from each subset of data bits, where the first group and the second group include different data bits from the subsets of data bits. The operations of 810 may be performed in accordance with examples as disclosed herein. In some examples, aspects of the operations of 810 may be performed by an encoder module 730 as described with reference to FIG. 7.

At 815, the method may include inverting a portion of the first codeword, a portion of the second codeword, or a portion of both codewords, based at least in part on the coding scheme and a respective target distribution of states for each codeword. The operations of 815 may be performed in accordance with examples as disclosed herein. In some examples, aspects of the operations of 815 may be performed by a balancing module 735 as described with reference to FIG. 7.

At 820, the method may include storing, after the inverting and according to the coding scheme, the first codeword and the second codeword in a set of ternary cells including the respective pairs of ternary cells. The operations of 820 may be performed in accordance with examples as disclosed herein. In some examples, aspects of the operations of 820 may be performed by a memory module 740 as described with reference to FIG. 7.

In some examples, an apparatus as described herein may perform a method or methods, such as the method 800. The apparatus may include, features, circuitry, logic, means, or instructions (e.g., a non-transitory computer-readable medium storing instructions executable by a processor) for dividing a set of received data bits into subsets of data bits for storage in respective pairs of ternary cells according to a coding scheme, each ternary cell programmable to a first state, a second state, or a third state, generating a first codeword that includes a first group of data bits including data bits from at least some of the subsets of data bits and a second codeword that includes a second group of data bits including data bits from each subset of data bits, where the first group and the second group include different data bits from the subsets of data bits, inverting a portion of the first codeword, a portion of the second codeword, or a portion of both codewords, based at least in part on the coding scheme and a respective target distribution of states for each codeword, and storing, after the inverting and according to the coding scheme, the first codeword and the second codeword in a set of ternary cells including the respective pairs of ternary cells.

Some examples of the method 800 and the apparatus described herein may further include operations, features, circuitry, logic, means, or instructions for adding one or more bits (e.g., padding bits) to the first codeword after the inverting and based at least in part on a difference between a distribution of states for the first codeword and the target distribution of states for the first codeword, where storing the first codeword may be based at least in part on adding the one or more bits to the first codeword.

Some examples of the method 800 and the apparatus described herein may further include operations, features, circuitry, logic, means, or instructions for adding one or more bits (e.g., padding bits) to the second codeword after the inverting and based at least in part on a difference between a distribution of states for the second codeword and the target distribution of states for the second codeword, where storing the second codeword may be based at least in part on adding the one or more bits to the second codeword.

Some examples of the method 800 and the apparatus described herein may further include operations, features, circuitry, logic, means, or instructions for determining a first quantity of data bits (e.g., $D_X$) to include in the first group of data bits for the first codeword based at least in part on the coding scheme and a quantity of parity bits for the first codeword, where the first group of data bits may be based at least in part on the first quantity. Some examples of the method 800 and the apparatus described herein may further include operations, features, circuitry, logic, means, or instructions for determining a second quantity of data bits (e.g., $D_{YZ}$) to include in the second group of data bits for the second codeword based at least in part on the coding scheme and a quantity of parity bits for the second codeword, where the second group of data bits may be based at least in part on the second quantity.

In some examples of the method 800 and the apparatus described herein, the quantity of data bits for the first codeword may be less than the quantity of the data bits for the second codeword (e.g., $D_X$ may be less than $D_{YZ}$).

In some examples of the method 800 and the apparatus described herein, the target distribution for the first codeword includes a target quantity for the first state (e.g., State A), and the target distribution for the second codeword includes a target quantity for the second state (e.g., State B) and a target quantity for the third state (e.g., State C).

Some examples of the method 800 and the apparatus described herein may further include operations, features, circuitry, logic, means, or instructions for determining, based at least in part on reading the set of ternary cells using a first voltage level, a quantity of the set of ternary cells in the first state and selecting a level for a first reference voltage (e.g., $V_{REF0}$) based at least in part on the target distribution and the quantity of the set of ternary cells in the first state.

Some examples of the method 800 and the apparatus described herein may further include operations, features, circuitry, logic, means, or instructions for determining, for the first group of data bits in the first codeword, a quantity of data bits with a first logic value (e.g., logic one), where the quantity of the set of ternary cells in the first state (e.g., State A) may be determined to be equal to the quantity of data bits with the first logic value.

Some examples of the method 800 and the apparatus described herein may further include operations, features, circuitry, logic, means, or instructions for determining, based at least in part on reading the set of ternary cells using a second voltage level, a quantity of the set of ternary cells in the second state and selecting a level for a second reference voltage (e.g., $V_{REF1}$) based at least in part on the target distribution and the quantity of the set of ternary cells in the second state (e.g., State B).

In some examples of the method 800 and the apparatus described herein, generating the first codeword may include operations, features, circuitry, logic, means, or instructions for applying an error correction code to the first group of data bits; and where generating the second codeword includes applying the error correction code to the second group of data bits.

Figure 9:
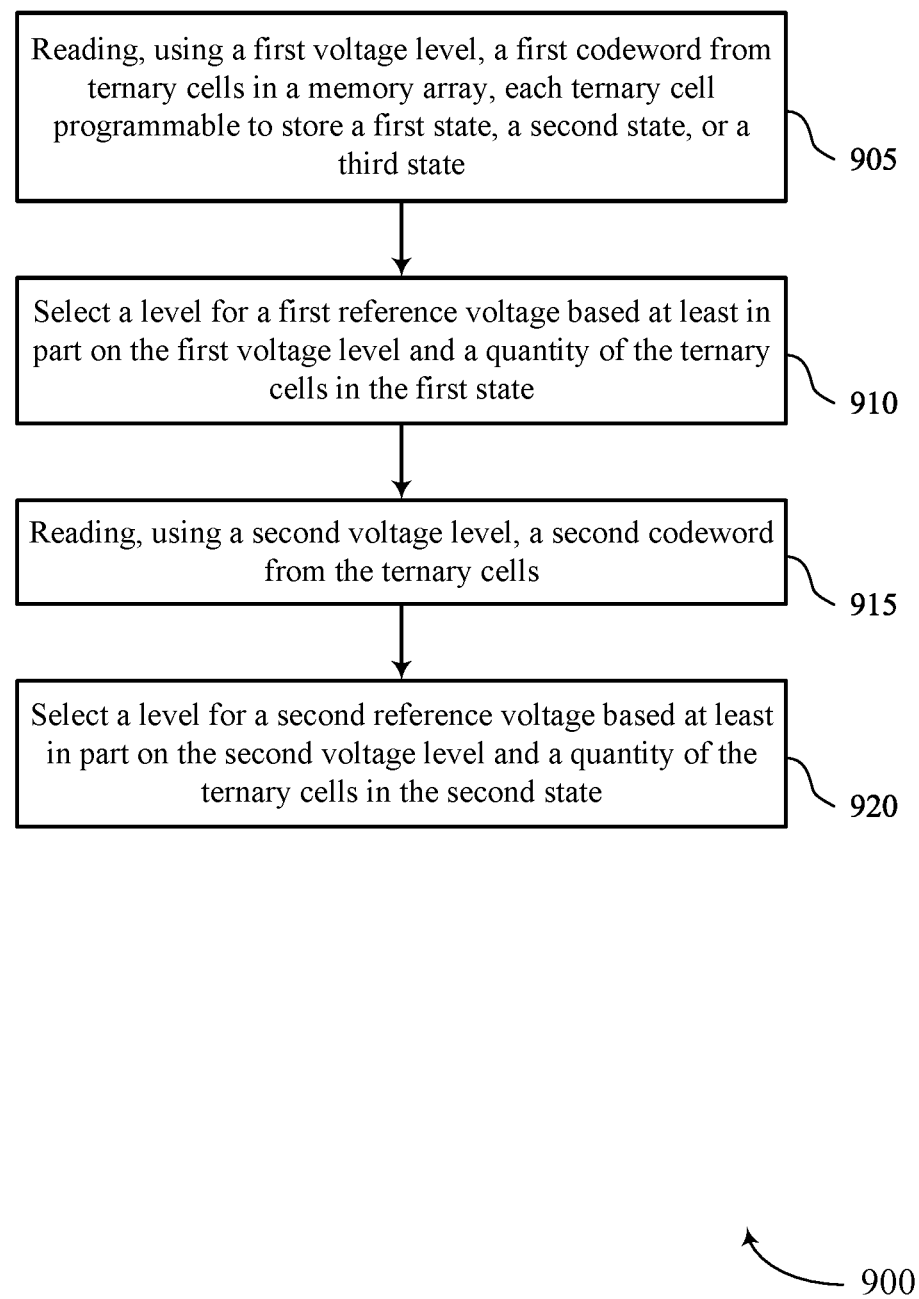

FIG. 9 shows a flowchart illustrating a method 900 that supports fixed weight codewords for ternary memory cells in accordance with examples as disclosed herein. The operations of method 900 may be implemented by a memory device or its components as described herein. For example, the operations of method 900 may be performed by a memory device as described with reference to FIGS. 1 through 7. In some examples, a memory device may execute a set of instructions to control the functional elements of the device to perform the described functions. Additionally or alternatively, the memory device may perform aspects of the described functions using special-purpose hardware.

At 905, the method may include reading, using a first voltage level, a first codeword (e.g., codeword(x)) from ternary cells in a memory array, each ternary cell programmable to store a first state, a second state, or a third state. The operations of 905 may be performed in accordance with examples as disclosed herein. In some examples, aspects of the operations of 905 may be performed by a memory module 740 as described with reference to FIG. 7.

At 910, the method may include selecting a level for a first reference voltage (e.g., $V_{REF0}$) based at least in part on the first voltage level and a quantity of the ternary cells in the first state (e.g., State A). The operations of 910 may be performed in accordance with examples as disclosed herein. In some examples, aspects of the operations of 910 may be performed by a dynamic reference module 745 as described with reference to FIG. 7.

At 915, the method may include reading, using a second voltage level, a second codeword from the ternary cells. The operations of 915 may be performed in accordance with examples as disclosed herein. In some examples, aspects of the operations of 915 may be performed by a memory module 740 as described with reference to FIG. 7.

At 920, the method may include selecting a level for a second reference voltage (e.g., $V_{REF1}$) based at least in part on the second voltage level and a quantity of the ternary cells in the second state (e.g., State B). The operations of 920 may be performed in accordance with examples as disclosed herein. In some examples, aspects of the operations of 920 may be performed by a dynamic reference module 745 as described with reference to FIG. 7.

In some examples, an apparatus as described herein may perform a method or methods, such as the method 900. The apparatus may include, features, circuitry, logic, means, or instructions (e.g., a non-transitory computer-readable medium storing instructions executable by a processor) for reading, using a first voltage level, a first codeword from ternary cells in a memory array, each ternary cell programmable to store a first state, a second state, or a third state, selecting a level for a first reference voltage based at least in part on the first voltage level and a quantity of the ternary cells in the first state, reading, using a second voltage level, a second codeword from the ternary cells, and selecting a level for a second reference voltage based at least in part on the second voltage level and a quantity of the ternary cells in the second state.

Some examples of the method 900 and the apparatus described herein may further include operations, features, circuitry, logic, means, or instructions for determining a set of data bits (e.g., data bits 305) from the first codeword and the second codeword and based at least in part on the first reference voltage and the second reference voltage and communicating the set of data bits to a requesting device.

Some examples of the method 900 and the apparatus described herein may further include operations, features, circuitry, logic, means, or instructions for determining, for the first codeword, a quantity of data bits with a first logic value (e.g., logic one), where the quantity of the ternary cells in the first state (e.g., State A) may be equal to the quantity of data bits with the first logic value.

Some examples of the method 900 and the apparatus described herein may further include operations, features, circuitry, logic, means, or instructions for generating a set of syndrome bits for the first codeword based at least in part on reading the first codeword using the first voltage level and determining that the first codeword has at least one error based at least in part on the set of syndrome bits, where the level for the first reference voltage may be selected based at least in part on the at least one error.

Some examples of the method 900 and the apparatus described herein may further include operations, features, circuitry, logic, means, or instructions for generating a set of syndrome bits for the second codeword based at least in part on reading the second codeword using the second voltage level and determining that the second codeword has at least one error based at least in part on the set of syndrome bits, where the level for the second reference voltage may be selected based at least in part on the at least one error.

Some examples of the method 900 and the apparatus described herein may further include operations, features, circuitry, logic, means, or instructions for determining a target distribution of states by using the first codeword, the target distribution including a target quantity for the first state (e.g., State A) and comparing the quantity of the ternary cells in the first state to the target quantity for the first state, where the level for the first reference voltage may be selected based at least in part on the comparison.

Some examples of the method 900 and the apparatus described herein may further include operations, features, circuitry, logic, means, or instructions for determining a target distribution of states by using the second codeword, the target distribution including a target quantity for the second state (e.g., State B) and comparing the quantity of the ternary cells in the second state to the target quantity for the second state, where the level for the second reference voltage may be selected based at least in part on the comparison.

In some examples of the method 900 and the apparatus described herein, at least some pairs of ternary cells represent two bits from the second codeword or at least some of the pairs of ternary cells represent a bit from the first codeword.

Figure 10:
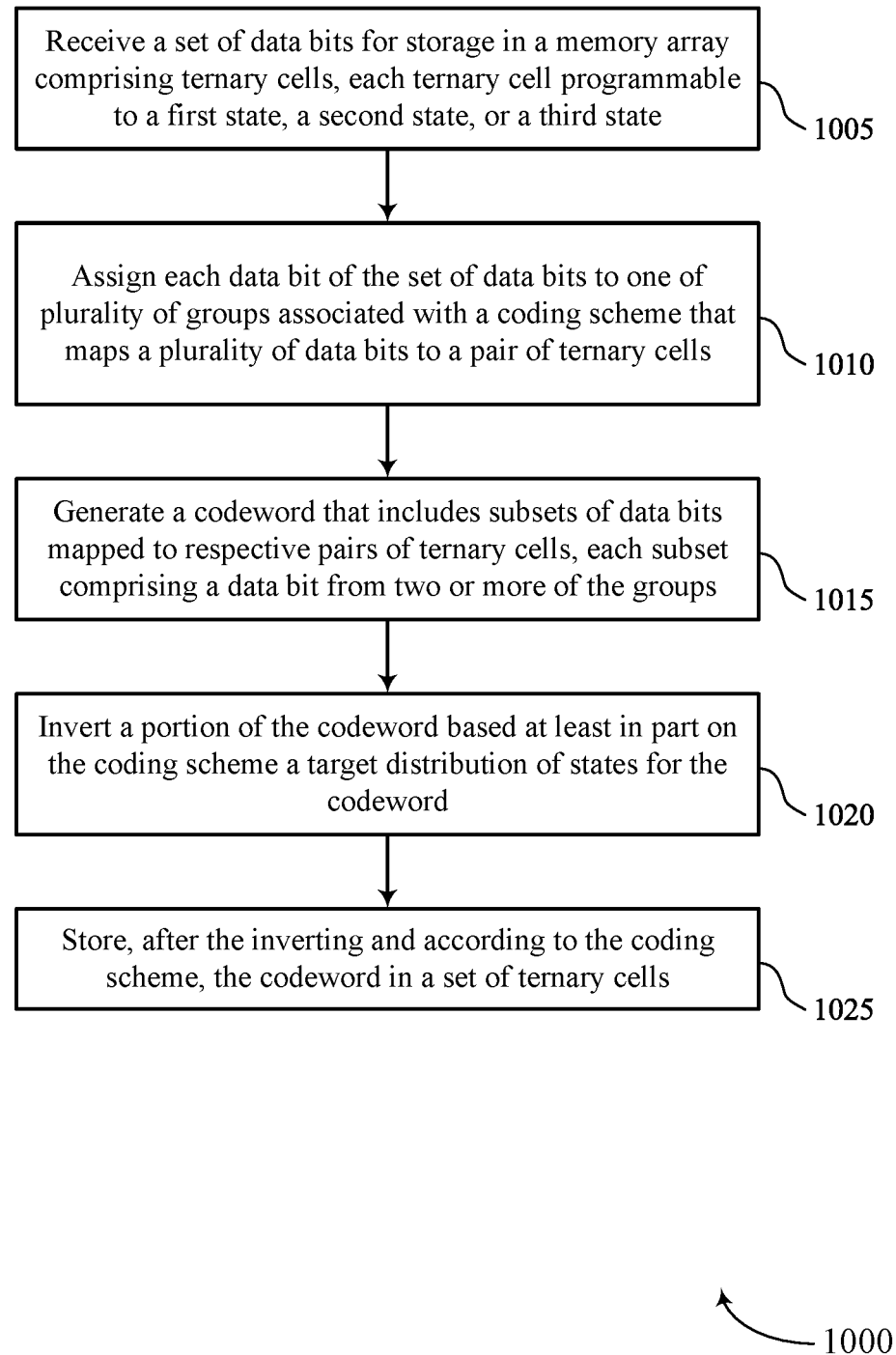

FIG. 10 shows a flowchart illustrating a method 1000 that supports fixed weight codewords for ternary memory cells in accordance with examples as disclosed herein. The operations of method 1000 may be implemented by a memory device or its components as described herein. For example, the operations of method 1000 may be performed by a memory device as described with reference to FIGS. 1 through 7. In some examples, a memory device may execute a set of instructions to control the functional elements of the device to perform the described functions. Additionally or alternatively, the memory device may perform aspects of the described functions using special-purpose hardware.

At 1005, the method may include receiving a set of data bits (e.g., data bits 305) for storage in a memory array including ternary cells, each ternary cell programmable to a first state, a second state, or a third state. The operations of 1005 may be performed in accordance with examples as disclosed herein. In some examples, aspects of the operations of 1005 may be performed by a controller 725 as described with reference to FIG. 7.

At 1010, the method may include assigning each data bit of the set of data bits to one of plurality of groups associated with a coding scheme that maps a plurality of data bits to a pair of ternary cells. For example, the method may include assigning some of the data bits to be x bits, some of the data bits to be y bits, and some of the data bits to be z bits. Thus, the method may include assigning the data bits to different bit positions associated with the coding scheme. The operations of 1010 may be performed in accordance with examples as disclosed herein. In some examples, aspects of the operations of 1010 may be performed by a controller 725 as described with reference to FIG. 7.

At 1015, the method may include generating a codeword (e.g., codeword(x, y, z)) that includes subsets of data bits (e.g., subsets of (x, y, z) bits) mapped to respective pairs of ternary cells, each subset including a data bit from two or more of the groups. The operations of 1015 may be performed in accordance with examples as disclosed herein. In some examples, aspects of the operations of 1015 may be performed by an encoder module 730 as described with reference to FIG. 7.

At 1020, the method may include inverting a portion of the codeword based at least in part on the coding scheme a target distribution of states for the codeword. The operations of 1020 may be performed in accordance with examples as disclosed herein. In some examples, aspects of the operations of 1020 may be performed by a balancing module 735 as described with reference to FIG. 7.

At 1025, the method may include storing, after the inverting and according to the coding scheme, the codeword in a set of ternary cells. The operations of 1025 may be performed in accordance with examples as disclosed herein. In some examples, aspects of the operations of 1025 may be performed by a memory module 740 as described with reference to FIG. 7.

In some examples, an apparatus as described herein may perform a method or methods, such as the method 1000. The apparatus may include, features, circuitry, logic, means, or instructions (e.g., a non-transitory computer-readable medium storing instructions executable by a processor) for receiving a set of data bits for storage in a memory array including ternary cells, each ternary cell programmable to a first state, a second state, or a third state, assigning each data bit of the set of data bits to one of plurality of groups associated with a coding scheme that maps a plurality of data bits to a pair of ternary cells, generating a codeword that includes subsets of data bits mapped to respective pairs of ternary cells, each subset including a data bit from two or more of the groups, inverting a portion of the codeword based at least in part on the coding scheme a target distribution of states for the codeword, and storing, after the inverting and according to the coding scheme, the codeword in a set of ternary cells.

Some examples of the method 1000 and the apparatus described herein may further include operations, features, circuitry, logic, means, or instructions for adding one or more bits (e.g., padding bits) to the codeword after the inverting and based at least in part on a difference between a distribution of states for the codeword and the target distribution, where storing the codeword may be based at least in part on adding the one or more bits to the codeword.

In some examples of the method 1000 and the apparatus described herein, the target distribution includes a quantity for the first state (e.g., State A), a quantity for the second state (e.g., State B), and a quantity for the third state (e.g., State C), and the quantity for the second state (e.g., State B) may be equal to the quantity for the third state (e.g., State C) and may be greater than the quantity for the first state (e.g., State A).

Some examples of the method 1000 and the apparatus described herein may further include operations, features, circuitry, logic, means, or instructions for reading the codeword from the set of ternary cells using a first voltage level and selecting a level for a first reference voltage (e.g., $V_{REF0}$) based at least in part on the target distribution and a quantity of the set of ternary cells in the first state.

Some examples of the method 1000 and the apparatus described herein may further include operations, features, circuitry, logic, means, or instructions for reading the codeword from the set of ternary cells using a second voltage level and selecting a level for a second reference voltage (e.g., $V_{REF1}$) based at least in part on the target distribution and a quantity of the set of ternary cells in the second state.

Figure 11:
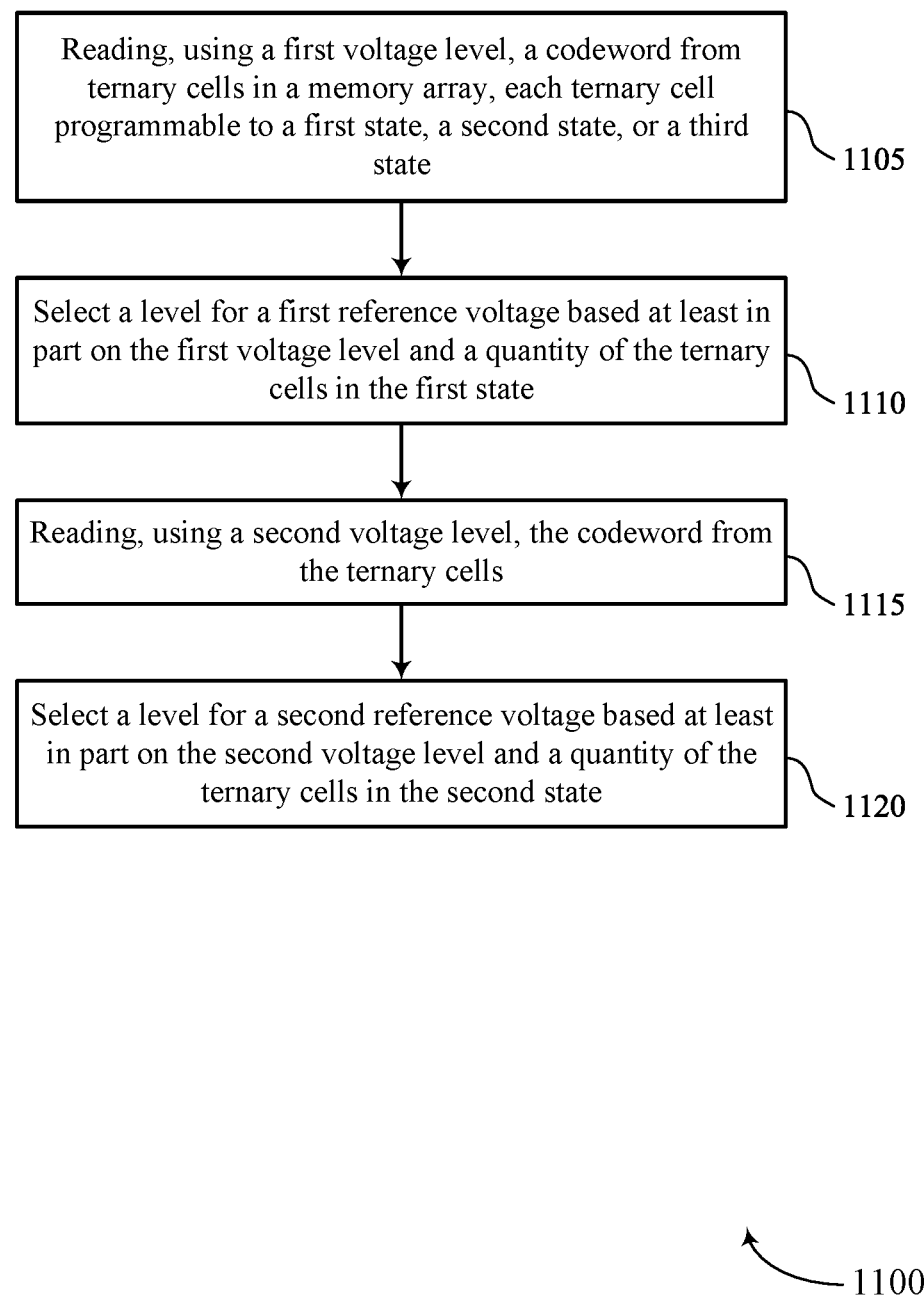

FIG. 11 shows a flowchart illustrating a method 1100 that supports fixed weight codewords for ternary memory cells in accordance with examples as disclosed herein. The operations of method 1100 may be implemented by a memory device or its components as described herein. For example, the operations of method 1100 may be performed by a memory device as described with reference to FIGS. 1 through 7. In some examples, a memory device may execute a set of instructions to control the functional elements of the device to perform the described functions. Additionally or alternatively, the memory device may perform aspects of the described functions using special-purpose hardware.

At 1105, the method may include reading, using a first voltage level, a codeword from ternary cells in a memory array, each ternary cell programmable to a first state, a second state, or a third state. The operations of 1105 may be performed in accordance with examples as disclosed herein. In some examples, aspects of the operations of 1105 may be performed by a memory module 740 as described with reference to FIG. 7.

At 1110, the method may include selecting a level for a first reference voltage (e.g., $V_{REF0}$) based at least in part on the first voltage level and a quantity of the ternary cells in the first state (e.g., State A). The operations of 1110 may be performed in accordance with examples as disclosed herein. In some examples, aspects of the operations of 1110 may be performed by a dynamic reference module 745 as described with reference to FIG. 7.

At 1115, the method may include reading, using a second voltage level, the codeword from the ternary cells. The operations of 1115 may be performed in accordance with examples as disclosed herein. In some examples, aspects of the operations of 1115 may be performed by a memory module 740 as described with reference to FIG. 7.

At 1120, the method may include selecting a level for a second reference voltage (e.g., $V_{REF1}$) based at least in part on the second voltage level and a quantity of the ternary cells in the second state (e.g., State B). The operations of 1120 may be performed in accordance with examples as disclosed herein. In some examples, aspects of the operations of 1120 may be performed by a dynamic reference module 745 as described with reference to FIG. 7.

In some examples, an apparatus as described herein may perform a method or methods, such as the method 1100. The apparatus may include, features, circuitry, logic, means, or instructions (e.g., a non-transitory computer-readable medium storing instructions executable by a processor) for reading, using a first voltage level, a codeword from ternary cells in a memory array, each ternary cell programmable to a first state, a second state, or a third state, selecting a level for a first reference voltage based at least in part on the first voltage level and a quantity of the ternary cells in the first state, reading, using a second voltage level, the codeword from the ternary cells, and selecting a level for a second reference voltage based at least in part on the second voltage level and a quantity of the ternary cells in the second state.

Some examples of the method 1100 and the apparatus described herein may further include operations, features, circuitry, logic, means, or instructions for determining a set of data bits (e.g., data bits 305) based at least in part on the first reference voltage and the second reference voltage and communicating the set of data bits to a requesting device.

Some examples of the method 1100 and the apparatus described herein may further include operations, features, circuitry, logic, means, or instructions for determining a target distribution of states by using the codeword, the target distribution including a target quantity for the first state (e.g., State A) and comparing the quantity of the ternary cells in the first state to the target quantity for the first state, where the level for the first reference voltage may be selected based at least in part on the comparison.

Some examples of the method 1100 and the apparatus described herein may further include operations, features, circuitry, logic, means, or instructions for determining a target distribution of states by using the codeword, the target distribution including a target quantity for the second state (e.g., State B) and comparing the quantity of the ternary cells in the second state to the target quantity for the second state, where the level for the second reference voltage may be selected based at least in part on the comparison.

Figure 12:
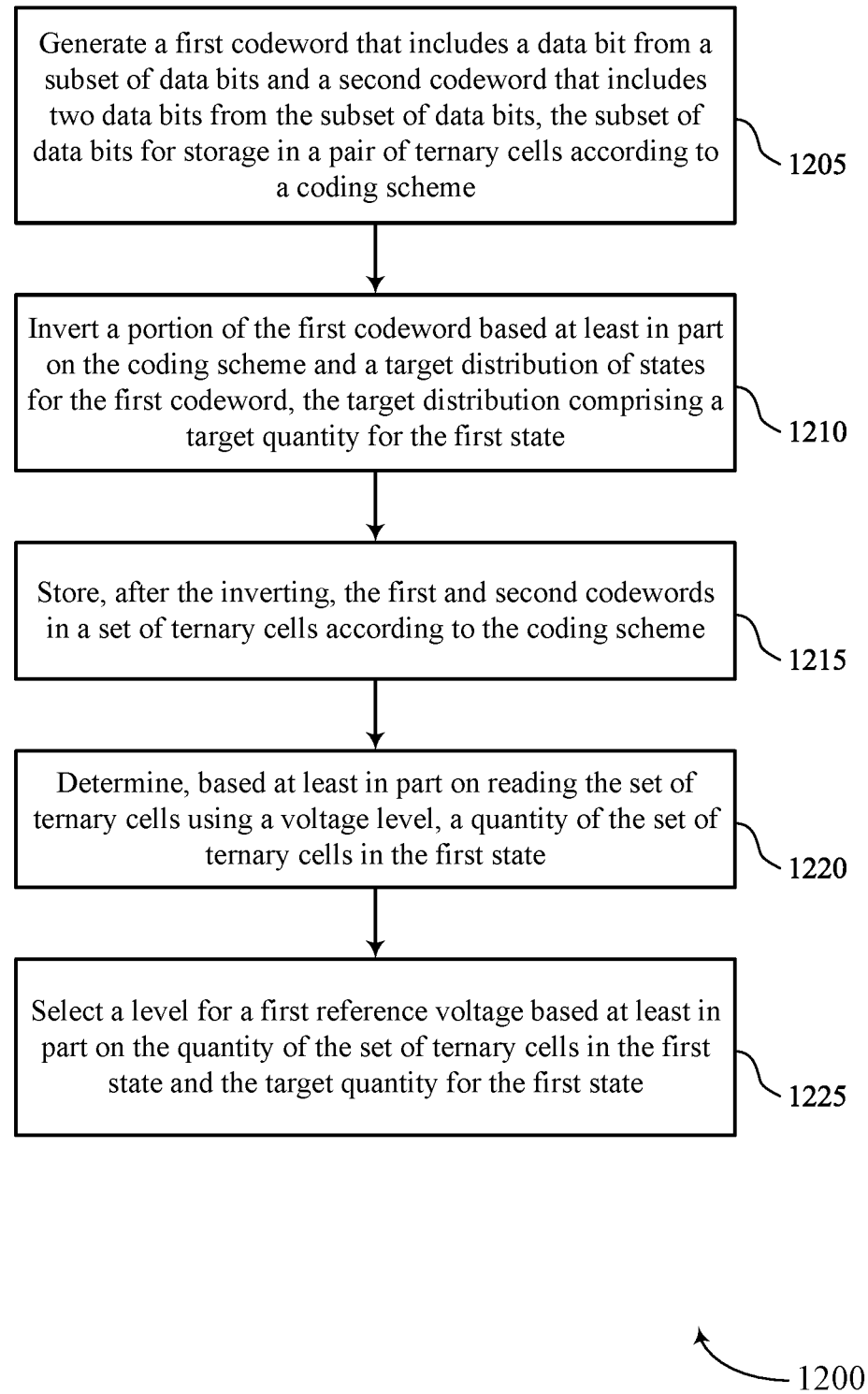

FIG. 12 shows a flowchart illustrating a method 1200 that supports fixed weight codewords for ternary memory cells in accordance with examples as disclosed herein. The operations of method 1200 may be implemented by a memory device or its components as described herein. For example, the operations of method 1200 may be performed by a memory device as described with reference to FIGS. 1 through 7. In some examples, a memory device may execute a set of instructions to control the functional elements of the device to perform the described functions. Additionally or alternatively, the memory device may perform aspects of the described functions using special-purpose hardware.

At 1205, the method may include generating a first codeword (e.g., codeword(x)) that includes a data bit (e.g., bit x) from a subset of data bits (e.g., a subset of (x, y, z) data bits) and a second codeword (e.g., codeword(y, z,)) that includes two data bits (e.g., y bit, z bit) from the subset of data bits, the subset of data bits for storage in a pair of ternary cells according to a coding scheme. The operations of 1205 may be performed in accordance with examples as disclosed herein. In some examples, aspects of the operations of 1205 may be performed by an encoder module 730 as described with reference to FIG. 7.

At 1210, the method may include inverting a portion of the first codeword based at least in part on the coding scheme and a target distribution of states for the first codeword, the target distribution including a target quantity for the first state. The operations of 1210 may be performed in accordance with examples as disclosed herein. In some examples, aspects of the operations of 1210 may be performed by a balancing module 735 as described with reference to FIG. 7.

At 1215, the method may include storing, after the inverting, the first and second codewords in a set of ternary cells according to the coding scheme. The operations of 1215 may be performed in accordance with examples as disclosed herein. In some examples, aspects of the operations of 1215 may be performed by a memory module 740 as described with reference to FIG. 7.

At 1220, the method may include determining, based at least in part on reading the set of ternary cells using a voltage level, a quantity of the set of ternary cells in the first state (e.g., State A). The operations of 1220 may be performed in accordance with examples as disclosed herein. In some examples, aspects of the operations of 1220 may be performed by a state module 750 as described with reference to FIG. 7.

At 1225, the method may include selecting a level for a first reference voltage (e.g., $V_{REF0}$) based at least in part on the quantity of the set of ternary cells in the first state and the target quantity for the first state. The operations of 1225 may be performed in accordance with examples as disclosed herein. In some examples, aspects of the operations of 1225 may be performed by a dynamic reference module 745 as described with reference to FIG. 7.

In some examples, an apparatus as described herein may perform a method or methods, such as the method 1200. The apparatus may include, features, circuitry, logic, means, or instructions (e.g., a non-transitory computer-readable medium storing instructions executable by a processor) for generating a first codeword that includes a data bit from a subset of data bits and a second codeword that includes two data bits from the subset of data bits, the subset of data bits for storage in a pair of ternary cells according to a coding scheme, inverting a portion of the first codeword based at least in part on the coding scheme and a target distribution of states for the first codeword, the target distribution including a target quantity for the first state, storing, after the inverting, the first and second codewords in a set of ternary cells according to the coding scheme, determining, based at least in part on reading the set of ternary cells using a voltage level, a quantity of the set of ternary cells in the first state, and selecting a level for a first reference voltage based at least in part on the quantity of the set of ternary cells in the first state and the target quantity for the first state.

In some examples of the method 1200 and the apparatus described herein, inverting, before the storing, a portion of the second codeword based at least in part on the coding scheme and a second target distribution of states for the second codeword, the second target distribution including a target quantity for the second state (e.g., State B).

Some examples of the method 1200 and the apparatus described herein may further include operations, features, circuitry, logic, means, or instructions for determining, based at least in part on reading the set of ternary cells using a second voltage level, a quantity of the set of ternary cells in the second state and selecting a level for a second reference voltage (e.g., $V_{REF1}$) based at least in part on the quantity of the set of ternary cells in the second state and the target quantity for the second state.

It should be noted that the methods described herein describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    dividing a set of received data bits into subsets of data bits for storage in respective pairs of ternary cells according to a coding scheme, each ternary cell programmable to a first state, a second state, or a third state;
    generating a first codeword that includes a first group of data bits comprising data bits from at least some of the subsets of data bits and a second codeword that includes a second group of data bits comprising data bits from each subset of data bits, where in the first group and the second group comprise different data bits from the subsets of data bits;
    inverting a portion of the first codeword, a portion of the second codeword, or a portion of both codewords, based at least in part on the coding scheme and a respective target distribution of states for each codeword; and
    storing, after the inverting and according to the coding scheme, the first codeword and the second codeword in a set of ternary cells comprising the respective pairs of ternary cells wherein, for the coding scheme, each state change of one of a respective pair of ternary cells results in less than two bit errors for each of the first codeword and the second codeword.

2. The method of claim 1, further comprising:
    adding one or more bits to the first codeword after the inverting and based at least in part on a difference between a distribution of states for the first codeword and the target distribution of states for the first codeword, wherein storing the first codeword is based at least in part on adding the one or more bits to the first codeword.

3. The method of claim 1, further comprising:
    adding one or more bits to the second codeword after the inverting and based at least in part on a difference between a distribution of states for the second codeword and the target distribution of states for the second codeword, wherein storing the second codeword is based at least in part on adding the one or more bits to the second codeword.

4. The method of claim 1, further comprising:
    determining a first quantity of data bits to include in the first group of data bits for the first codeword based at least in part on the coding scheme and a quantity of parity bits for the first codeword, wherein the first group of data bits is based at least in part on the first quantity; and
    determining a second quantity of data bits to include in the second group of data bits for the second codeword based at least in part on the coding scheme and a quantity of parity bits for the second codeword, wherein the second group of data bits is based at least in part on the second quantity.

5. The method of claim 4, wherein the first quantity of data bits for the first codeword is less than the second quantity of the data bits for the second codeword.

6. The method of claim 1, wherein the target distribution for the first codeword comprises a target quantity for the first state, and wherein the target distribution for the second codeword comprises a target quantity for the second state and a target quantity for the third state.

7. The method of claim 1, further comprising:
    determining, based at least in part on reading the set of ternary cells using a first voltage level, a quantity of the set of ternary cells in the first state; and
    selecting a level for a first reference voltage based at least in part on the target distribution and the quantity of the set of ternary cells in the first state.

8. The method of claim 7, further comprising:
    determining, for the first group of data bits in the first codeword, a quantity of data bits with a first logic value, wherein the quantity of the set of ternary cells in the first state is determined to be equal to the quantity of data bits with the first logic value.

9. The method of claim 7, further comprising:
    determining, based at least in part on reading the set of ternary cells using a second voltage level, a quantity of the set of ternary cells in the second state; and selecting a level for a second reference voltage based at least in part on the target distribution and the quantity of the set of ternary cells in the second state.

10. The method of claim 1, wherein generating the first codeword comprises:
applying an error correction code to the first group of data bits; and wherein generating the second codeword comprises:
applying the error correction code to the second group of data bits.

11. A method, comprising:
reading, using a first voltage level, a first codeword from pairs of ternary cells in a memory array, each ternary cell programmable to store a first state, a second state, or a third state, wherein the first codeword is based on a first group of data bits from subsets of data bits stored in the pairs of ternary cells;
selecting a level for a first reference voltage based at least in part on the first codeword, the first voltage level and a quantity of the ternary cells in the first state;
reading, using a second voltage level, a second codeword from the pairs of ternary cells, wherein the second codeword is based on a second group of data bits from the subsets of data bits stored in the pairs of ternary cells, and wherein each state change of one of a respective pair of ternary cells results in less than two bit errors for each of the first codeword and the second codeword; and
selecting a level for a second reference voltage based at least in part on the second codeword, the second voltage level and a quantity of the ternary cells in the second state.

12. The method of claim 11, further comprising:
determining a set of data bits from the first codeword and the second codeword and based at least in part on the first reference voltage and the second reference voltage; and
communicating the set of data bits to a requesting device.

13. The method of claim 11, further comprising:
determining, for the first codeword, a quantity of data bits with a first logic value, wherein the quantity of the ternary cells in the first state is equal to the quantity of data bits with the first logic value.

14. The method of claim 11, further comprising:
generating a set of syndrome bits for the first codeword based at least in part on reading the first codeword using the first voltage level; and
determining that the first codeword has at least one error based at least in part on the set of syndrome bits, wherein the level for the first reference voltage is selected based at least in part on the at least one error.

15. The method of claim 11, further comprising:
generating a set of syndrome bits for the second codeword based at least in part on reading the second codeword using the second voltage level; and
determining that the second codeword has at least one error based at least in part on the set of syndrome bits, wherein the level for the second reference voltage is selected based at least in part on the at least one error.

16. The method of claim 11, further comprising:
determining a target distribution of states by using the first codeword, the target distribution comprising a target quantity for the first state; and
comparing the quantity of the ternary cells in the first state to the target quantity for the first state, wherein the level for the first reference voltage is selected based at least in part on the comparison.

17. The method of claim 11, further comprising:
determining a target distribution of states by using the second codeword, the target distribution comprising a target quantity for the second state; and
comparing the quantity of the ternary cells in the second state to the target quantity for the second state, wherein the level for the second reference voltage is selected based at least in part on the comparison.

18. The method of claim 11, wherein at least some of the pairs of ternary cells represent two bits from the second codeword or at least some of the pairs of ternary cells represent a bit from the first codeword.

19. A method, comprising:
receiving a set of data bits for storage in a memory array comprising ternary cells, each ternary cell programmable to a first state, a second state, or a third state;
assigning each data bit of the set of data bits to one of plurality of groups associated with a coding scheme that maps a plurality of data bits to a pair of ternary cells;
generating a codeword that includes subsets of data bits mapped to respective pairs of ternary cells, each subset comprising a data bit from two or more of the groups;
inverting a portion of the codeword based at least in part on the coding scheme and a target distribution of states represented by bits from the subsets of data bits for the codeword; and
storing, after the inverting and according to the coding scheme, the codeword in a set of ternary cells wherein, for the coding scheme, each state change of one of a respective pair of ternary cells results in less than two bit errors for the codeword.

20. The method of claim 19, further comprising:
adding one or more bits to the codeword after the inverting and based at least in part on a difference between a distribution of states for the codeword and the target distribution, wherein storing the codeword is based at least in part on adding the one or more bits to the codeword.

21. The method of claim 19, wherein the target distribution comprises a quantity for the first state, a quantity for the second state, and a quantity for the third state, and wherein the quantity for the second state is equal to the quantity for the third state and is greater than the quantity for the first state.

22. The method of claim 19, further comprising:
reading the codeword from the set of ternary cells using a first voltage level; and
selecting a level for a first reference voltage based at least in part on the target distribution and a quantity of the set of ternary cells in the first state.

23. The method of claim 22, further comprising:
reading the codeword from the set of ternary cells using a second voltage level; and
selecting a level for a second reference voltage based at least in part on the target distribution and a quantity of the set of ternary cells in the second state.

24. A method, comprising:
reading, using a first voltage level, a codeword from ternary cells in a memory array, each ternary cell programmable to a first state, a second state, or a third state;
determining, based at least in part on reading the ternary cells using the first voltage level or an adjusted first voltage level, a quantity of the of ternary cells in the first state;

selecting a level for a first reference voltage based at least in part on the first voltage level, the adjusted first voltage level, the quantity of the ternary cells in the first state, or a combination thereof;

reading, using a second voltage level, the codeword from the ternary cells;

determining, based at least in part on reading the ternary cells using the second voltage level or an adjusted second voltage level, a quantity of the ternary cells in the second state; and selecting a level for a second reference voltage based at least in part on the codeword, the second voltage level, the adjusted second voltage level, the quantity of the ternary cells in the second state, or a combination thereof.

25. The method of claim 24, further comprising:
determining a set of data bits based at least in part on the first reference voltage and the second reference voltage; and
communicating the set of data bits to a requesting device.

26. The method of claim 24, further comprising:
determining a target distribution of states by using the codeword, the target distribution comprising a target quantity for the first state; and
comparing the quantity of the ternary cells in the first state to the target quantity for the first state, wherein the level for the first reference voltage is selected based at least in part on the comparison.

27. The method of claim 24, further comprising:
determining a target distribution of states by using the codeword, the target distribution comprising a target quantity for the second state; and
comparing the quantity of the ternary cells in the second state to the target quantity for the second state, wherein the level for the second reference voltage is selected based at least in part on the comparison.

28. A method, comprising:
generating a first codeword that includes a data bit from a subset of data bits and a second codeword that includes two data bits from the subset of data bits, the subset of data bits for storage in a pair of ternary cells according to a coding scheme;

inverting a portion of the first codeword based at least in part on the coding scheme and a target distribution of states for the first codeword, the target distribution comprising a target quantity for a first state;

storing, after the inverting, the first and second codewords in a set of ternary cells according to the coding scheme;

reading, using a voltage level, the first codeword from the set of ternary cells;

determining, based at least in part on reading the set of ternary cells using the voltage level or an adjusted voltage level, a quantity of the set of ternary cells in the first state; and selecting a level for a first reference voltage based at least in part on the first code word, the voltage level, the adjusted voltage level, the quantity of the set of ternary cells in the first state, the target quantity for the first state, or a combination thereof.

29. The method of claim 28, further comprising:
inverting, before the storing, a portion of the second codeword based at least in part on the coding scheme and a second target distribution of states for the second codeword, the second target distribution comprising a target quantity for a second state.

30. The method of claim 28, further comprising:
determining, based at least in part on reading the set of ternary cells using a second voltage level, a quantity of the set of ternary cells in a second state; and
selecting a level for a second reference voltage based at least in part on the quantity of the set of ternary cells in the second state and the target quantity for the second state.

* * * * *